US012628425B2

(12) United States Patent
  Lou et al.

(10) Patent No.:  US 12,628,425 B2
(45) Date of Patent:       May 12, 2026

(54) DISPLAY PANEL AND SPLICED DISPLAY DEVICE

(71) Applicant: Shanghai Tianma Micro-Electronics Co., Ltd., Shanghai (CN)

(72) Inventors: Tenggang Lou, Shanghai (CN); Yiran Zhu, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 498 days.

(21) Appl. No.: 18/191,979

(22) Filed: Mar. 29, 2023

(65) Prior Publication Data

US 2023/0246038 A1     Aug. 3, 2023

(30) Foreign Application Priority Data

Nov. 7, 2022    (CN) .......................... 202211387563.1

(51) Int. Cl.
   *G09G 3/32*          (2016.01)
   *H01L 25/075*      (2006.01)
   (Continued)

(52) U.S. Cl.
   CPC ............... *H10D 86/60* (2025.01); *G09G 3/32* (2013.01); *H01L 25/0753* (2013.01);
   (Continued)

(58) Field of Classification Search
   CPC .......... G09G 3/32–3291; G09G 2300/02–026; G09G 2300/0421–043; G09G 2300/0465;
   (Continued)

(56) References Cited

U.S. PATENT DOCUMENTS

2018/0323180 A1*  11/2018  Cok ..................... G09G 3/2014
2021/0375197 A1*  12/2021  Dai .......................... G09G 3/32
             (Continued)

FOREIGN PATENT DOCUMENTS

CN       211858095 U       11/2020
CN       113223420 A        8/2021
CN       113470538 A       10/2021

OTHER PUBLICATIONS

First Chinese Office Action mailed on Apr. 18, 2024, issued in the corresponding Chinese Application No. 202211387563.1, filed on Nov. 7, 2022, 19 pages.

*Primary Examiner* — Nathan Danielsen
(74) *Attorney, Agent, or Firm* — CHRISTENSEN O'CONNOR JOHNSON KINDNESS PLLC

(57)                ABSTRACT

Provided are a display panel and a spliced display device. The display panel includes first and second edges, first and second pixel rows, and first spacing regions. The first pixel row is adjacent to the first edge and includes first sub-pixels and each including a first light-emitting device and a first pixel circuit. The second pixel row includes second sub-pixels and each including a second light-emitting device and a second pixel circuit. The first spacing region is located at a side of the second pixel row close to the first edge. The second pixel rows include a second A pixel row adjacent to the first pixel row. The first pixel circuit is located in the first spacing region corresponding to the second A pixel row, and the second pixel circuit is located at a side of the second light-emitting device close to the first edge.

23 Claims, 19 Drawing Sheets

(51) Int. Cl.
  *H10D 86/40*    (2025.01)
  *H10D 86/60*    (2025.01)

(52) U.S. Cl.
  CPC ... *H10D 86/441* (2025.01); *G09G 2300/0426*
   (2013.01); *G09G 2300/0842* (2013.01); *G09G*
              *2310/08* (2013.01)

(58) Field of Classification Search
  CPC .... G09G 2300/0842; G09G 2310/0264–0275;
     G09G 2310/04; G09G 2310/06; G09G
      2310/08; G09G 2320/02; G09G
     2320/0233; G09G 2320/0242; G09G
      2340/14; G09G 2340/145; G09G
     2356/00; G06F 3/14; G06F 3/1423–1446;
       H10D 86/441; H10D 86/60; H01L
              25/0753
  See application file for complete search history.

(56)        References Cited

U.S. PATENT DOCUMENTS

2023/0345763 A1 * 10/2023   Feng ..................... G09G 3/3233
2024/0405179 A1 * 12/2024   Wang ........................ G09F 9/33

* cited by examiner

DISPLAY PANEL AND SPLICED DISPLAY DEVICE

CROSS-REFERENCE TO RELATED APPLICATIONS

The present application claims priority to Chinese Patent Application No. 202211387563.1, filed on Nov. 7, 2022, the content of which is incorporated herein by reference in its entirety.

TECHNICAL FIELD

The present disclosure relates to the display technical field, and particularly, to a display panel and a spliced display device.

BACKGROUND

When a display panel having a bezel is applied in a large-sized spliced display device, the light-emitting regions of adjacent display panels will be separated by a distance of widths of at least two bezels, resulting in an obvious splicing gap formed when the spliced display device displays images, thereby negatively affecting the display effect.

SUMMARY

In a first aspect, the present disclosure provides a display panel, including: a first edge and a second edge that are opposite to each other along a first direction; pixel rows arranged along the first direction and including a first pixel row and second pixel rows; and first spacing regions corresponding to the second pixel rows in a one-to-one correspondence. In an embodiment, the first pixel row is adjacent to the first edge and includes first sub-pixels arranged along a second direction, and each of the first sub-pixels includes a first light-emitting device and a first pixel circuit that are electrically connected to each other. In an embodiment, each of the second pixel rows includes second sub-pixels arranged along the second direction, and each of the second sub-pixels includes a second light-emitting device and a second pixel circuit that are electrically connected to each other. In an embodiment, the second direction intersects with the first direction. In an embodiment, each of the first spacing regions is adjacent to a corresponding one second pixel row of the second pixel rows corresponding to the first spacing region, and is located at a side of the corresponding one second pixel row close to the first edge. In an embodiment, the second pixel rows include a second A pixel row adjacent to the first pixel row, the first pixel circuit is located at a side of the first light-emitting device away from the first edge, the first pixel circuit is located in the first spacing region corresponding to the second A pixel row, and the second pixel circuit is located at a side of the second light-emitting device close to the first edge.

In a second aspect, the present disclosure provides a spliced display device including at least two display panels. In an embodiment, each of the at least two display panels is the display panel provided in the first aspect, and the at least two display panels are spliced together along the first direction.

BRIEF DESCRIPTION OF DRAWINGS

For clearly describing embodiments of the present disclosure and embodiments in related art, accompanying drawings necessary for illustrating these embodiments are briefly introduced as below. The accompanying drawings described below illustrate only some embodiments of the present disclosure. Based on these drawings, those skilled in the art can obtain other drawings without creative efforts.

DESCRIPTION OF EMBODIMENTS

In order to better illustrate technical solutions of the present disclosure, the embodiments of the present disclosure are described in detail with reference to the drawings.

It should be clear that the described embodiments are merely part of the embodiments of the present disclosure rather than all of the embodiments. All other embodiments obtained by those skilled in the art without paying creative labor shall fall into the protection scope of the present disclosure.

The terms used in the embodiments of the present disclosure are merely for the purpose of describing specific embodiment, rather than limiting the present disclosure. The terms "a", "an", "the" and "the" in a singular form in some embodiments of the present disclosure and the attached claims are also intended to include plural forms thereof, unless noted otherwise.

It should be understood that the term "and/or" used in the context of the present disclosure is to describe a correlation relation of related objects, indicating that there can be three relations, e.g., A and/or B can indicate A alone, both A and B, and B alone. In addition, the symbol "/" in the context generally indicates that the relation between the objects in front and at the back of "/" is an "or" relationship.

Figure 1:
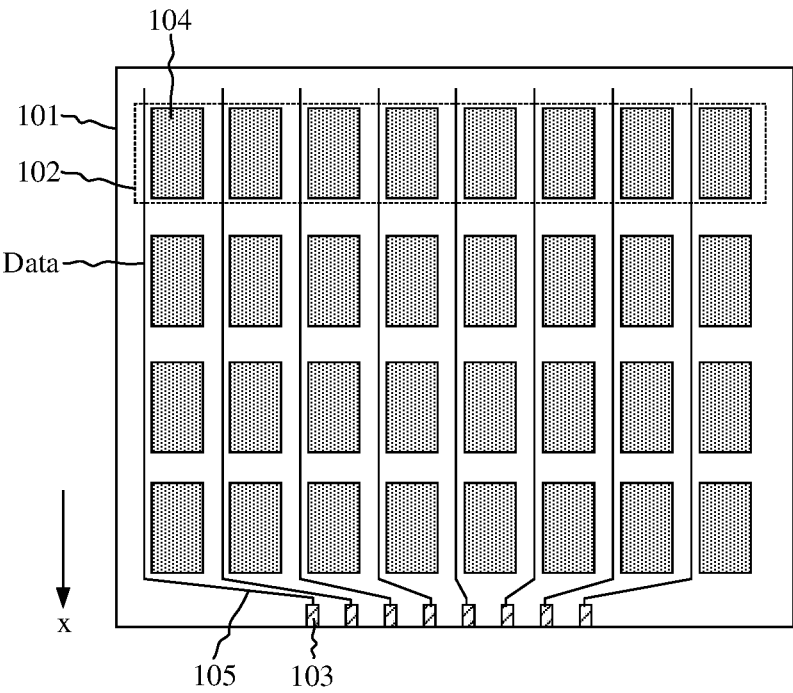
FIG. 1 is a top view of a display panel provided in related art.

FIG. 1 is a top view of a display panel 101 in related art. As shown in FIG. 1, the display panel 101 includes multiple pixel rows 102 arranged along a first direction x and multiple pins 103 located at a lower bezel of the display panel 101, the pins 103 are configured to provide driving signals to the sub-pixels 104 in the pixel rows 102 so as to achieve a normal display of the display panel 101. Exemplarily, the pins 103 can be electrically connected to the data lines Data via fan-out lines 105 to provide data signals to the sub-pixels 104 in the pixel rows 102.

Figure 2:
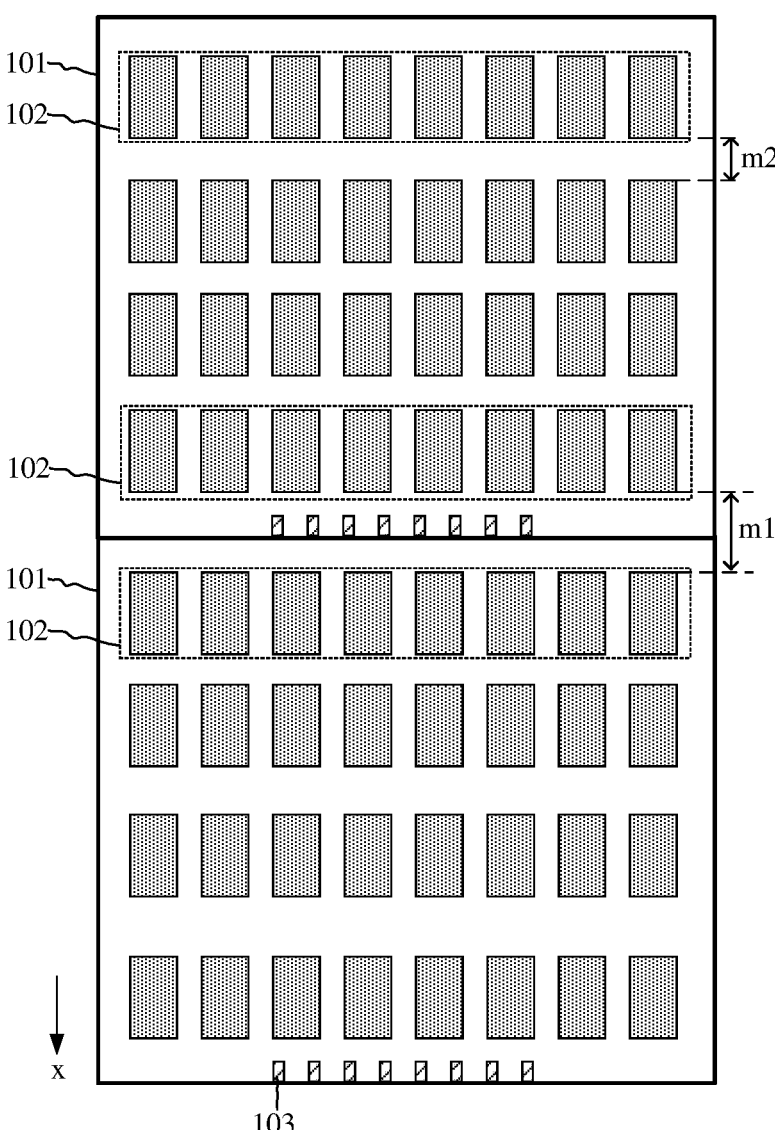
FIG. 2 is a top view of a spliced display device provided in related art.

It is found that, in order to provide enough space for accommodating the pins 103, a lower bezel of the display panel 101 is usually relatively wide in the related design. However, in this case, when the display panel 101 is applied in a large-sized spliced display device, as shown in FIG. 2, which is a top view of a spliced display device in related art, for two display panels 101 adjacent to each other in the first direction x, the last pixel row 102 in the former display panel 101 and the first pixel row 102 in the latter display panel 101 will be far apart from each other. A distance m1 between two adjacent pixel rows 102 respectively located in different display panels 101 is much greater than a distance m2 between two adjacent pixel rows 102 located in a same display panel 101. In this case, when the spliced display device displays images, an obvious visual splicing gap is formed between two display panels 101, resulting in non-uniformity of the display effect.

Considering that the fan-out line 105 and grinding chamfer also occupy a part of the space at the lower bezel, if the visual splicing gap is weakened by simply reducing the width of the lower bezel, there will be a quite small space for accommodating the fan-out lines 105 and the pins 103. As a result, the wiring design is difficult, and signal interference may occur easily.

In view of the above, some embodiments of the present disclosure provide a display panel, and the display panel can be a light-emitting diode (LED) display panel, for example, a mini LED display panel or a micro LED display panel.

Figure 3:
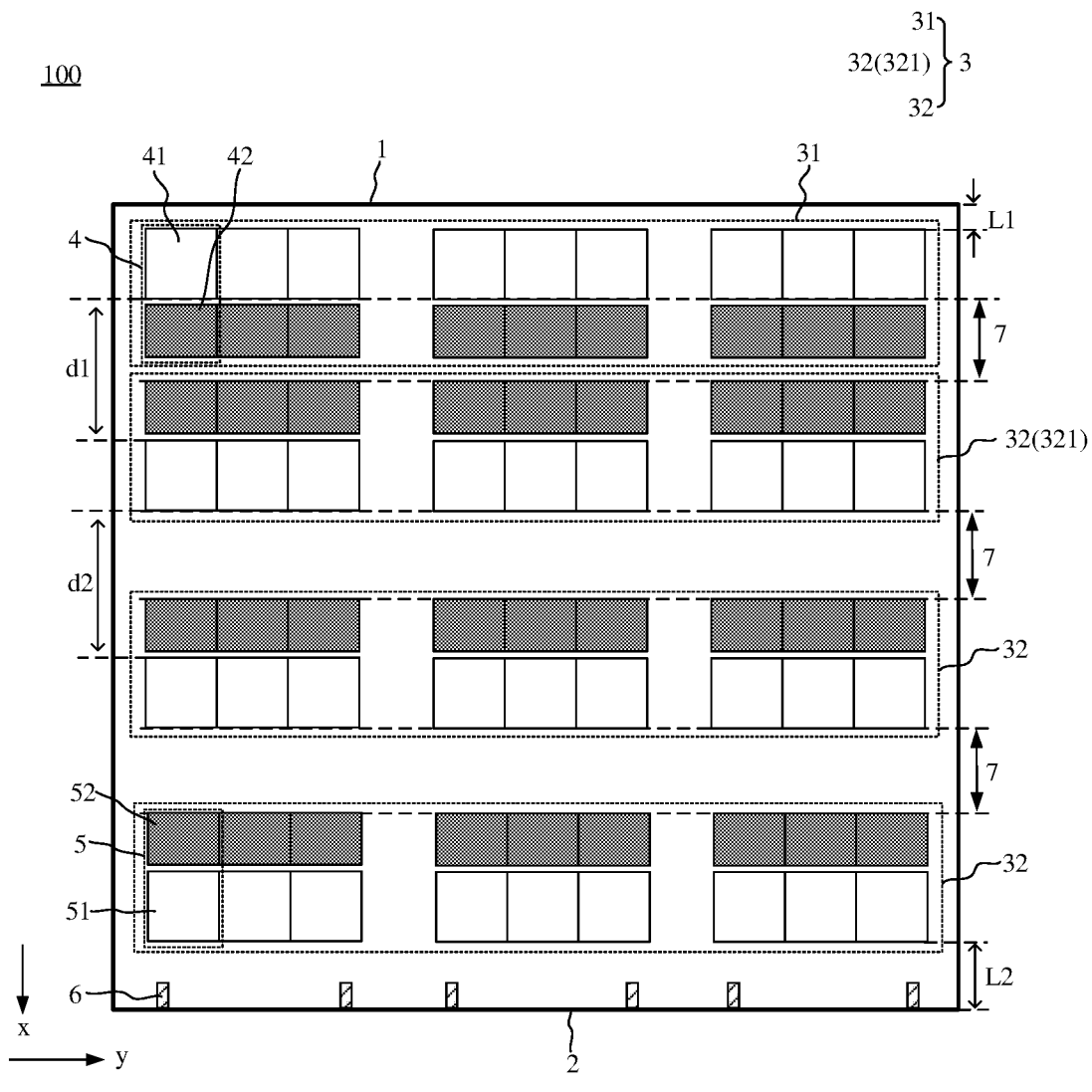
FIG. 3 is a top view of a display panel provided by some embodiments of the present disclosure.
Figure 4:
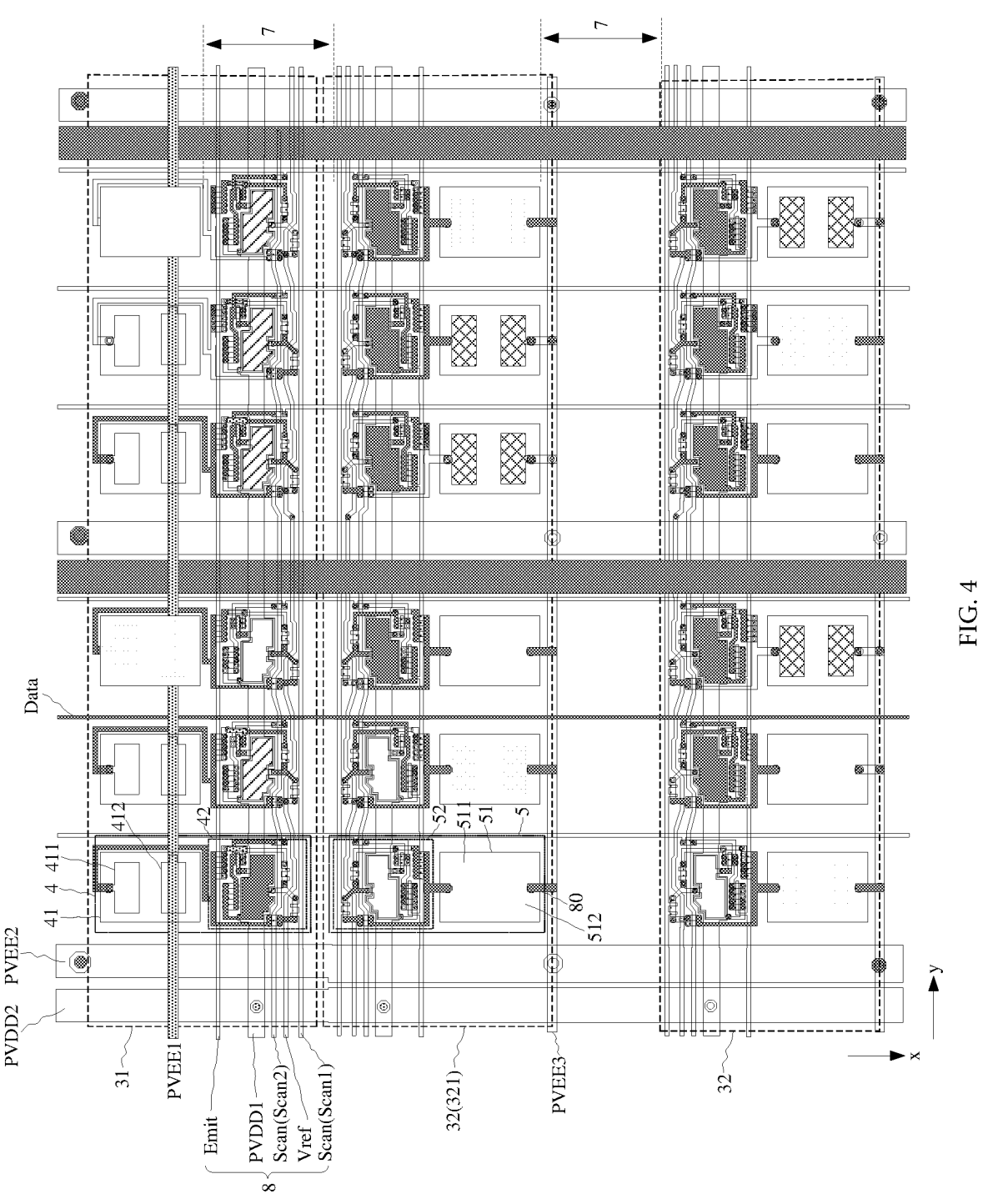
FIG. 4 is a layer schematic diagram of a display panel provided by some embodiments of the present disclosure.

FIG. 3 is a top view of a display panel 100 provided by some embodiments of the present disclosure, and FIG. 4 is a layer schematic diagram of a display panel 100 provided by some embodiments of the present disclosure. As shown in FIG. 3 and FIG. 4, the display panel 100 includes a first edge 1 and a second edge 2 that are opposite to each other in a first direction x, and multiple pixel rows 3 arranged along the first direction x. The pixel rows 3 include a first pixel row 31 and second pixel rows 32. The first pixel row 31 is adjacent to the first edge 1. That is, the first pixel row 31 is the pixel row 3 closest to the first edge 1 among the pixel rows 3, and the second pixel row 32 is a pixel row 3 other than the first pixel row 31.

The first pixel row 31 includes multiple first sub-pixels 4 arranged along a second direction y, the first sub-pixel 4 includes a first light-emitting device 41 and a first pixel circuit 42 that are electrically connected to each other, the second pixel row 32 includes multiple second sub-pixels 5 arranged along the second direction y, and the second sub-pixel 5 includes a second light-emitting device 51 and a second pixel circuit 52 that are electrically connected to each other. Each of the first light-emitting device 41 and the second light-emitting device 51 can be a mini LED or a micro LED, and the first direction x intersects with the second direction y.

The display panel 100 also includes multiple first spacing regions 7 corresponding to the multiple second pixel rows 32 in a one-to-one correspondence. The first spacing region 7 is located at a side of the second pixel row 32, corresponding to this first spacing region 7, close to the first edge 1, and is adjacent to this second pixel row 32. In some embodiments, the first spacing regions 7 corresponding to different second pixel rows 32 have a same width in the first direction x, so that the second light-emitting devices 51 in different second pixel rows 32 are equally spaced apart from each other.

The second pixel rows 32 include a second A pixel row 321 adjacent to the first pixel row 31. The first pixel circuit 42 is located at a side of the first light-emitting device 41 away from the first edge 1 and is also located in the first spacing region 7 corresponding to the second A pixel row 321, and the second pixel circuit 52 is located at a side of the second light-emitting device 51 close to the first edge 1.

In the embodiments of the present disclosure, the first edge 1 and the second edge 2 can be two cut edges of the display panel 100 opposite to each other in the first direction x. That is, two outermost edges of the display panel 100. In the embodiments of the present disclosure, a part of the bezel between the first edge 1 and an edge of the first pixel row 31 is referred to as an upper bezel, and another part of the bezel between the second edge 2 and an edge of the second pixel row 32 closest to the second edge 2 is referred to as a lower bezel.

The display panel 100 includes pins 6 located at the lower bezel and close to the second edge 2, and the pins 6 are configured to provide driving signals to the first sub-pixels 4 and the second sub-pixels 5 to drive the display panel 100 to emit light normally.

In a conventional structural design of a display panel, pixel circuits in different sub-pixels are arranged in a same manner. That is, the pixel circuits in all sub-pixels are located at a same side of the light-emitting devices electrically connected thereto. However, in the embodiments of the present disclosure, a position of the first pixel circuit 42 of the first sub-pixel 4 is different from a position of the second pixel circuit 52 of the second sub-pixel 5.

In the embodiments of the present disclosure, the first pixel circuit 42 of the first sub-pixel 4 is moved from an outer side of the first light-emitting device 41 (a side close to the first edge 1) to the first spacing region 7 located at an inner side of the first light-emitting device 41 (a side away from the first edge 1), which is equivalent to freeing up the space that would be occupied by the first pixel circuit 42 at the outer side of the first light-emitting device 41. In this way, peripheral lines, peripheral circuits and other structures at the outer side of the first light-emitting device 41 can be moved towards the first light-emitting device 41 accordingly, and then, when cutting the display panel 100, a distance between the cut line (first edge 1) corresponding to the upper bezel and the first pixel row 31 can be adjusted to be reduced, thereby narrowing a width of the upper bezel of the display panel 100.

Figure 5:
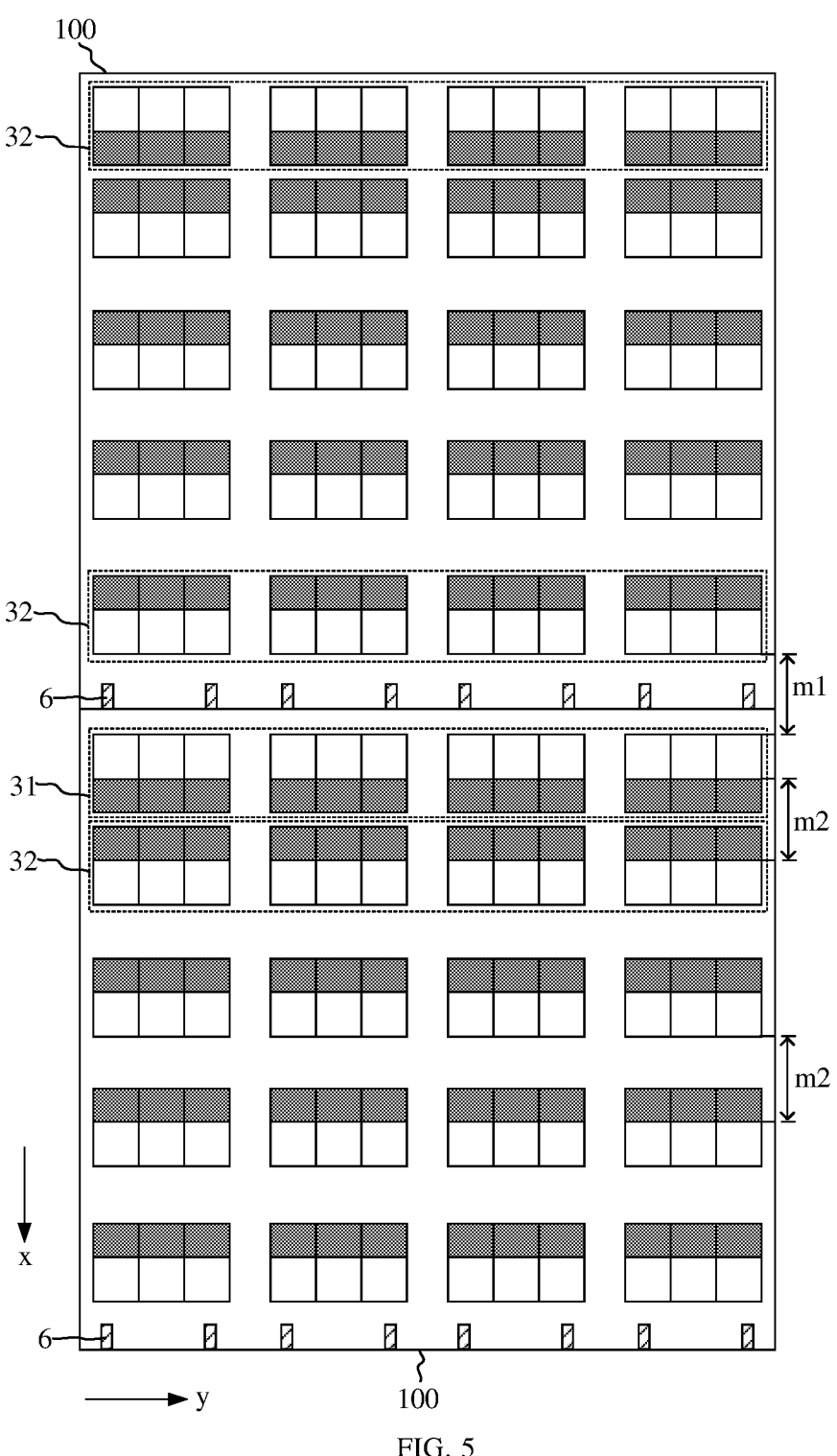
FIG. 5 is a top view of a spliced display device provided by some embodiments of the present disclosure.

After narrowing the upper bezel of the display panel 100, when the display panel 100 is applied in a spliced display device, as shown in FIG. 5, which is a top view of a spliced display device provided by some embodiments of the present disclosure, for two display panels 100 adjacent to each other in the first direction x, a sum of a width of the lower bezel of the former display panel 100 and a width of the upper bezel of the latter display panel 100 can be reduced. That is, a difference between a distance m1 between the second light-emitting device 51 of the last second pixel row 32 in the former display panel 100 and the first light-emitting device 41 of the first pixel row 31 in the latter display panel 100 and a distance m2 between the light-emitting devices respectively located in any other two adjacent pixel lines 3, so that the light-emitting devices in the whole spliced display device tend to be equally spaced apart from each other, thereby weakening the visual splicing gap and achieving seamlessly splicing between the display panels 100. After narrowing the width of the upper bezel of the display panel 100, in some embodiments of the present disclosure, the width of the upper bezel can be compensated to the width of the lower bezel. For example, if the width of the upper bezel is reduced by n1, the width n1 can be all compensated to the width of the lower bezel to increase the width of the lower bezel by n1, or the width n1 can be partially compensated to the width of the lower bezel by n2, where n2<n1, so as to increase the width of the lower bezel of the display panel 100 without changing the design size of the display panel 100 or reducing the design size of the display panel 100. In this way, more space can be provided for accommodating the pins 6, thereby avoiding that the pins 6 and the fan-out lines are arranged too close to each other, and thus avoiding signal interference therebetween. If the lower bezel of the display panel 100 already has enough space for accommodating the pins 6, the width of the lower bezel of the display panel 100 may be not adjusted, and the upper bezel of the display panel 100 is narrowed only to further eliminate the visual splicing gap.

In summary, using the technical solution provided by the embodiments of the present disclosure, when the display panel 100 is applied in the spliced display device, it can achieve seamless splicing, eliminate the visual splicing gap, optimize or enhance the display effect of the spliced display device, provide enough space for accommodating the pins 6 without increasing the design size of the display panel 100, and reduce signal interference.

In the embodiments of the present disclosure, the first pixel circuit 42 is disposed at an inner side of the first light-emitting device 41 not only by exchanging the positions of the first pixel circuit 42 and the first light-emitting device 41. In the embodiments of the present disclosure, the first spacing region 7 is provided between the pixel rows 3, thereby providing a space for accommodating the first pixel circuit 42 after adjusting its position. In some embodiments, the position of the first pixel circuit 42 is adjusted without changing the position of the first light-emitting device 41.

The mini LED and micro LED have a small size, so it is possible to provide many sub-pixels per unit area, and even if the first spacing region 7 is provided between the pixel rows 3 and the first spacing region 7 has a width that can accommodate the first pixel circuit 42, it is possible to ensure that the display panel 100 has a high pixels per inch (PPI), for example, the PPI of the display panel 100 can be within a range from 80 to 100. In other words, the spliced display devices in related art are mostly large-sized products, such as, a LED spliced screen, a movie screen, and a remote viewing electronic device, and these display devices do not have very high requirements for PPI, which are generally much lower than the requirement for PPI of a cell phone, a computer or any other display device. Therefore, the display panel 100 provided by the embodiments of the present disclosure is able to meet the requirement for PPI of the spliced display device even if the first spacing region 7 is provided between the pixel rows 3.

In some embodiments, referring to FIG. 3 again, a distance L1 between the first edge 1 and an edge of the first light-emitting device 41 (hereinafter referred to as a distance between the first edge 1 and the first light-emitting device 41) and a distance L2 between the second edge 2 and an edge of the second light-emitting device 51 closest to the second edge (hereinafter referred to as a distance between the second edge 2 and the second light-emitting device 51 closest to the second edge 2) satisfy: L2>L1. An edge of the light-emitting device can be illustrated as an edge of an orthographic projection of the light-emitting device in a direction perpendicular to a plane of the display panel 100.

By adjusting the position of the first pixel circuit 42 to narrow the width of the upper bezel, the width of the upper bezel can be further smaller than the width of the lower bezel. When the display panel 100 is applied in the spliced display device, the reduced width of the upper bezel can be used to reduce the distance m1, so that it is substantially the same as the distance m2, in order to achieve seamless splicing. Moreover, in order to optimize or enhance the wiring design of the pins 6 and the fan-out lines at the lower bezel, a width smaller than or equal to the narrowed width of the upper bezel can be compensated to the width of the lower bezel, so as to widen the lower bezel without increasing the design size of the display panel 100, and thus to provide more space for the pins 6 and fan-out lines.

Figure 6:
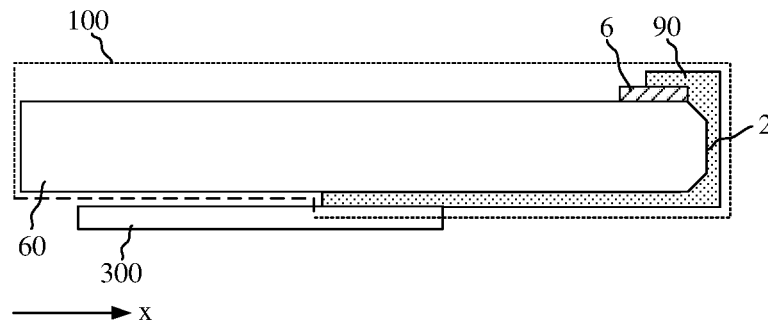
FIG. 6 is a schematic diagram showing connection between a display panel and a circuit board provided by some embodiments of the present disclosure.

FIG. 6 is a schematic diagram showing a connection between the display panel 100 and the circuit board 300 provided by some embodiments of the present disclosure. In some embodiments, as shown in FIG. 6, the display panel 100 also includes a pin 6 close to the second edge 2, the pin 6 is electrically connected to an end of a side line 90, the side line 90 is bent to a backlight side of the display panel 100, and another end of the side line 90 is electrically connect to the circuit board 300. The circuit board 300 is located at the backlight side of the display panel 100 and is configured to provide a variety of signals to the display panel 100 to drive the display panel 100 to display images. The circuit board 300 can be a flexible printed circuit (FPC), a chip on film (COF), or an adapter printed circuit board, etc.

Figure 7:
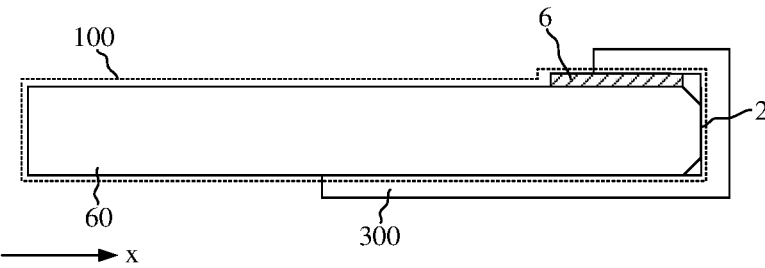
FIG. 7 is another schematic diagram showing connection between a display panel and a circuit board provided by some embodiments of the present disclosure.

In a conventional configuration, as shown in FIG. 7, which is another schematic diagram showing connection between the display panel 100 and the circuit board 300 provided by the embodiment of the present disclosure, the pin 6 of the display panel 100 is usually directly bound to a circuit board pin of the circuit board 300, and the circuit board 300 is then bent to the backlight side of the display panel 100. In such a configuration, the pin 6 of the display panel 100 can be bound to and be in contact with the circuit board pin of the circuit board 300, and in order to improve the binding reliability, the pin 6 can have a large area. For example, the pin 6 has a size in the first direction x ranging from 400 μm to 700 μm, which results in that the pin 6 occupies a large area at the lower bezel.

In the embodiments of the present disclosure, the pin 6 of the display panel 100 is electrically connected to the board 300 through the side line 90. Compared to a case where the pin 6 is in direct contact with the circuit board pin, higher connection reliability can be achieved by the pin 6 having a small area when the pin 6 is in contact with and connected to the side line 90 in the embodiments of the present disclosure. For example, in such a configuration, the size of the pin 6 in the first direction x ranges only from 50 μm to 80 μm.

Therefore, such a configuration can significantly reduce the design area of the pin 6 and thus save the space occupies by the pin 6 at the lower bezel. In this regard, the embodiments of the present disclosure can further narrow the width of the lower bezel while narrowing the width of the upper bezel, and thus the distance m1 can be reduced when the display panel 100 is applied in the spliced display device to further eliminate the visual splicing gap.

In some embodiments, referring to FIG. 4 again, the display panel 100 also includes a first driver signal line 8 electrically connected to the first pixel circuit 42, and the first driver signal line 8 extends in the second direction y and is located in the first spacing region 7 corresponding to the second A pixel row 321.

The the first driver signal line 8 electrically connected to the first pixel circuit 42 is provided in the first spacing region 7 corresponding to the second A pixel row 321. In this case, it can avoid that the first driver signal line 8 occupies a space outside the first light-emitting device 41, thereby freeing up more width outside the first light-emitting device 41 that can be cut off, and helping to further narrow the width of the upper bezel of the display panel 100. Moreover, the first driver signal line 8 and the first pixel circuit 42 are both located in the first spacing region 7 corresponding to the second A pixel row 321, a connection distance between the first driver signal line 8 and the first pixel circuit 42 is relatively small, so that the first driver signal line 8 can be directly connected to the first pixel circuit 42 without providing a connection line bypassing a side of the first light-emitting device 41, thereby simplifying the wiring design as well as freeing up more wiring space.

In some embodiments, referring to FIG. 4 again, the first pixel circuit 42 is electrically connected to a scanning signal line Scan, a first positive power supply signal line PVDD1, a reset signal line Vref, and a light-emitting control signal line Emit. The scanning signal line Scan may include a first scanning signal line Scan1 and a second scanning signal line Scan2.

The first scanning signal line Scan1 extends along the second direction y and is configured to provide a first scanning signal to the first pixel circuit 42. The second scanning signal line Scan2 extends along the second direction y and is configured to provide a second scanning signal to the first pixel circuit 42. The first positive power supply signal line PVDD1 extends along the second direction y and is configured to provide a positive power supply signal to the first pixel circuit 42. The reset signal line Vref extends along the second direction y and is configured to provide a reset signal to the first pixel circuit 42. The light-emitting control signal line Emit extends along the second direction y and is configured to provide a light-emitting control signal to the first pixel circuit 42. That is, each of the scanning signal line Scan, the first positive power supply signal line PVDD1, the reset signal line Vref, and the light-emitting control signal line Emit extends along the second direction y and is configured to provide a driving signal to the first pixel circuit 42.

In some embodiments of the present disclosure, the first driver signal line 8 can include at least one of the scanning signal line Scan, the first positive power supply signal line PVDD1, the reset signal line Vref, and the light-emitting control signal line Emit.

Figure 8:
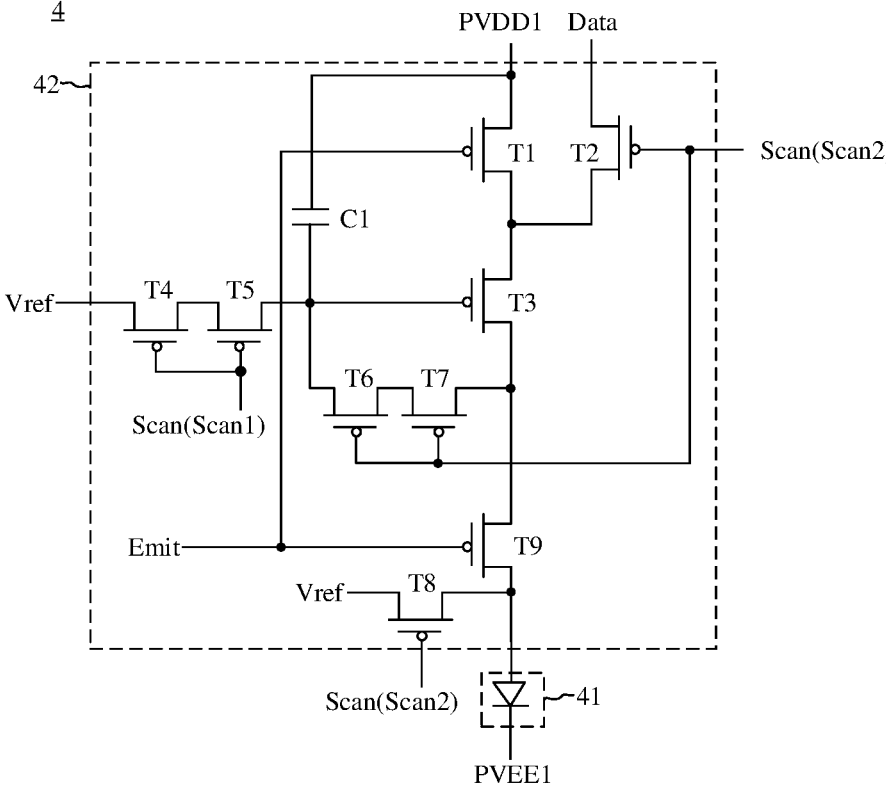
FIG. 8 is a circuit schematic diagram of a first sub-pixel provided by some embodiments of the present disclosure

In the embodiments of the present disclosure, each of the first pixel circuit 42 and the second pixel circuit 52 can adopt the circuit structure of the pixel circuit as shown in FIG. 8. Taking the first pixel circuit 42 as an example, the connection manner and function of each first driver signal line 8 and the operation principle of the first pixel circuit 42 are described as follows.

Figure 9:
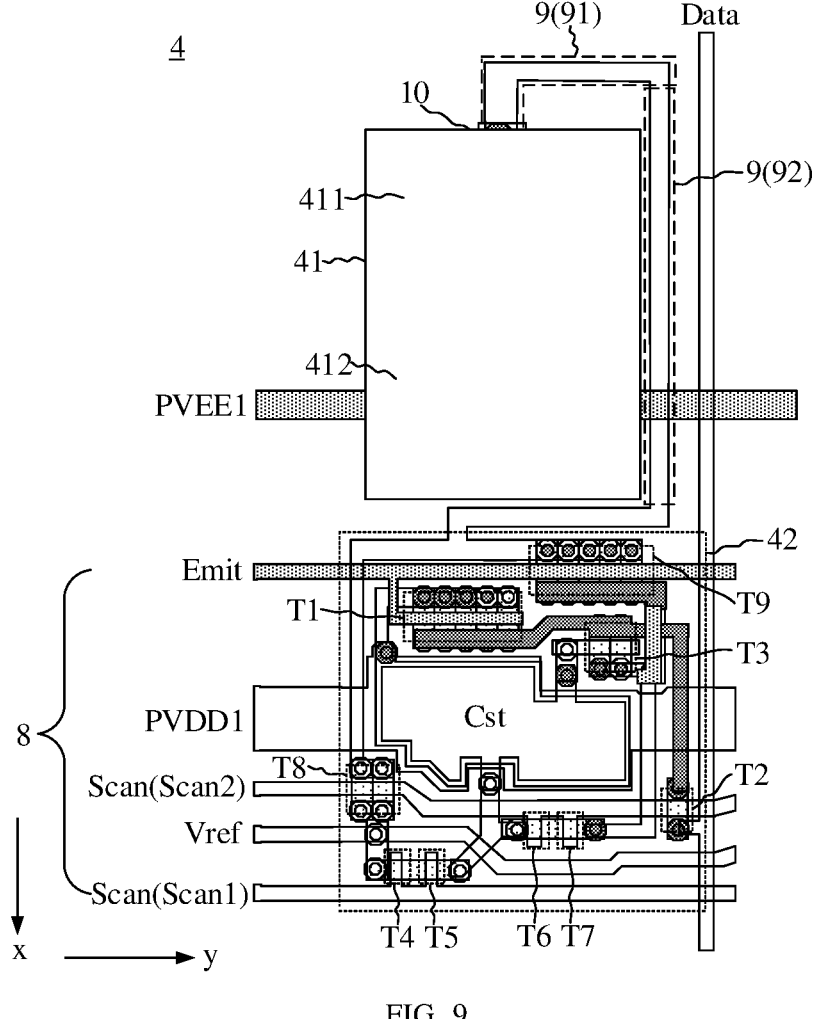
FIG. 9 is a layer schematic diagram of a first sub-pixel provided by some embodiments of the present disclosure.

FIG. 8 is a circuit schematic diagram of the first sub-pixel 4 provided by some embodiments of the present disclosure, and FIG. 9 is a layer schematic diagram of the first sub-pixel 4 provided by some embodiments of the present disclosure. As shown in FIG. 8 and FIG. 9, the first pixel circuit 42 can include a storage capacitor C1, and a first transistor T1 to a ninth transistor T9.

A gate of the fourth transistor T4 and a gate of the fifth transistor T5 are electrically connected to the first scanning signal line Scan1, a first electrode of the fourth transistor T4 is electrically connected to the reset signal line Vref, a second electrode of the fourth transistor T4 is electrically connected to a first electrode of the fifth transistor T5, and a second electrode of the fifth transistor T5 is electrically connected to a gate of the third transistor T3.

A gate of the second transistor T2 is electrically connected to the second scanning signal line Scan2, a first electrode of the second transistor T2 is electrically connected to a data line Data, and a second electrode of the second transistor T2 is electrically connected to a first electrode of the third transistor T3. A gate of the sixth transistor T6 and a gate of the seventh transistor T7 are electrically connected to the second scanning signal line Scan2. A first electrode of the seventh transistor T7 is electrically connected to the first electrode of the third transistor T3, and a second electrode of the seventh transistor T7 is electrically connected to a first electrode of the sixth transistor T6. A second electrode of the sixth transistor T6 is electrically connected to the gate of the third transistor T3. A gate of the eighth transistor T8 is electrically connected to the second scanning signal line Scan2, a first electrode of the eighth transistor T8 is electrically connected to the reset signal line Vref, and a second electrode of the eighth transistor T8 is electrically connected to the first light-emitting device 41.

A gate of the first transistor T1 and a gate of the ninth transistor T9 are electrically connected to the light-emitting control signal line Emit, a first electrode of the first transistor T1 is electrically connected to the first positive power supply signal line PVDD1, and a second electrode of the first transistor T1 is electrically connected to the first electrode of the third transistor T3. A first electrode of the ninth transistor T9 is electrically connected to the second electrode of the third transistor T3, and a second electrode of the ninth transistor T9 is electrically connected to the first light-emitting device 41.

A first electrode plate of the storage capacitor C is electrically connected to the first positive power supply signal line PVDD1, and a second electrode plate of the storage capacitor C is electrically connected to the gate of the third transistor T3.

Figure 10:
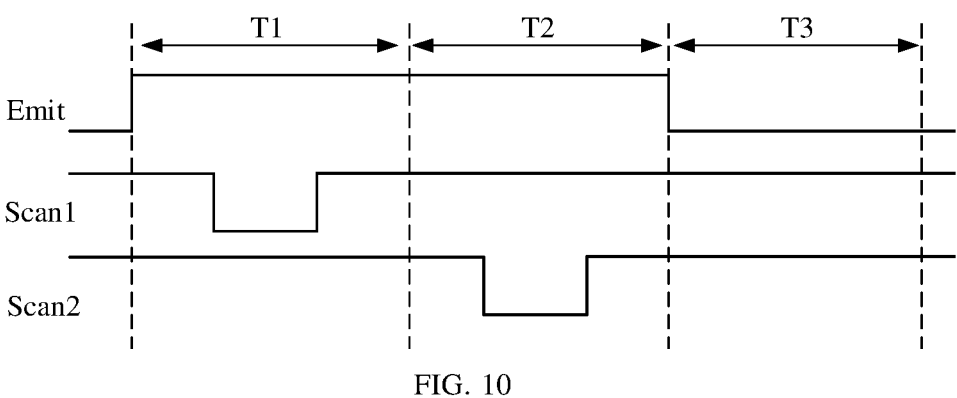
FIG. 10 is a timing sequence corresponding to a first pixel circuit provided by some embodiments of the present disclosure.

FIG. 10 is a timing sequence corresponding to the first pixel circuit 42 provided by some embodiments of the present disclosure. As shown in FIG. 10, an operation process of the first pixel circuit 42 includes an initialization period T1, a charging period T2, and a light-emitting period T3.

During the initialization period T1, the first scanning signal line Scan1 provides a low level, and the fourth transistor T4 and the fifth transistor T5 write a reset voltage provided by the reset signal line Vref to the gate of the third transistor T3 to initialize a potential of the gate of the third transistor T3.

During the charging period T2, the second scanning signal line Scan2 provides a low level, the second transistor T2, the sixth transistor T6 and the seventh transistor T7 write a data voltage provided by the data line Data to the gate of the third transistor T3 to compensate a threshold of the third transistor T3, and the eighth transistor T8 writes the provided reset voltage to the first light-emitting device 41 to initialize a potential of an anode 411 of the first light-emitting device 41.

During the light-emitting period T3, the light-emitting control signal line Emit provides a low level, and the first transistor T1 and the ninth transistor T9 transmit a driving current, which is converted by the positive power supply voltage provided by the first positive power supply signal line PVDD1 and the data voltage provided by the data line Data to the first light-emitting device 41, to drive the first light-emitting device 41 to emit light.

Referring to FIG. 4, the display panel 100 can include a second negative power supply signal line PVEE2 and a second positive power supply signal line PVDD2 each extending along the first direction x. The second negative power supply signal line PVEE2 is electrically connected to the first negative power supply signal line PVEE1. The second negative power supply signal lines PVEE2 and the first negative power supply signal lines PVEE1 form a grid-like structure to reduce an overall line load on the negative power supply signal lines. Similarly, the second positive power supply signal line PVDD2 is electrically connected to the first positive power supply signal line PVDD1, and the second positive power supply signal lines PVDD2 and the first positive power supply signal lines PVDD1 form a grid-like structure to reduce an overall line load on the positive power supply signal lines.

Figure 11:
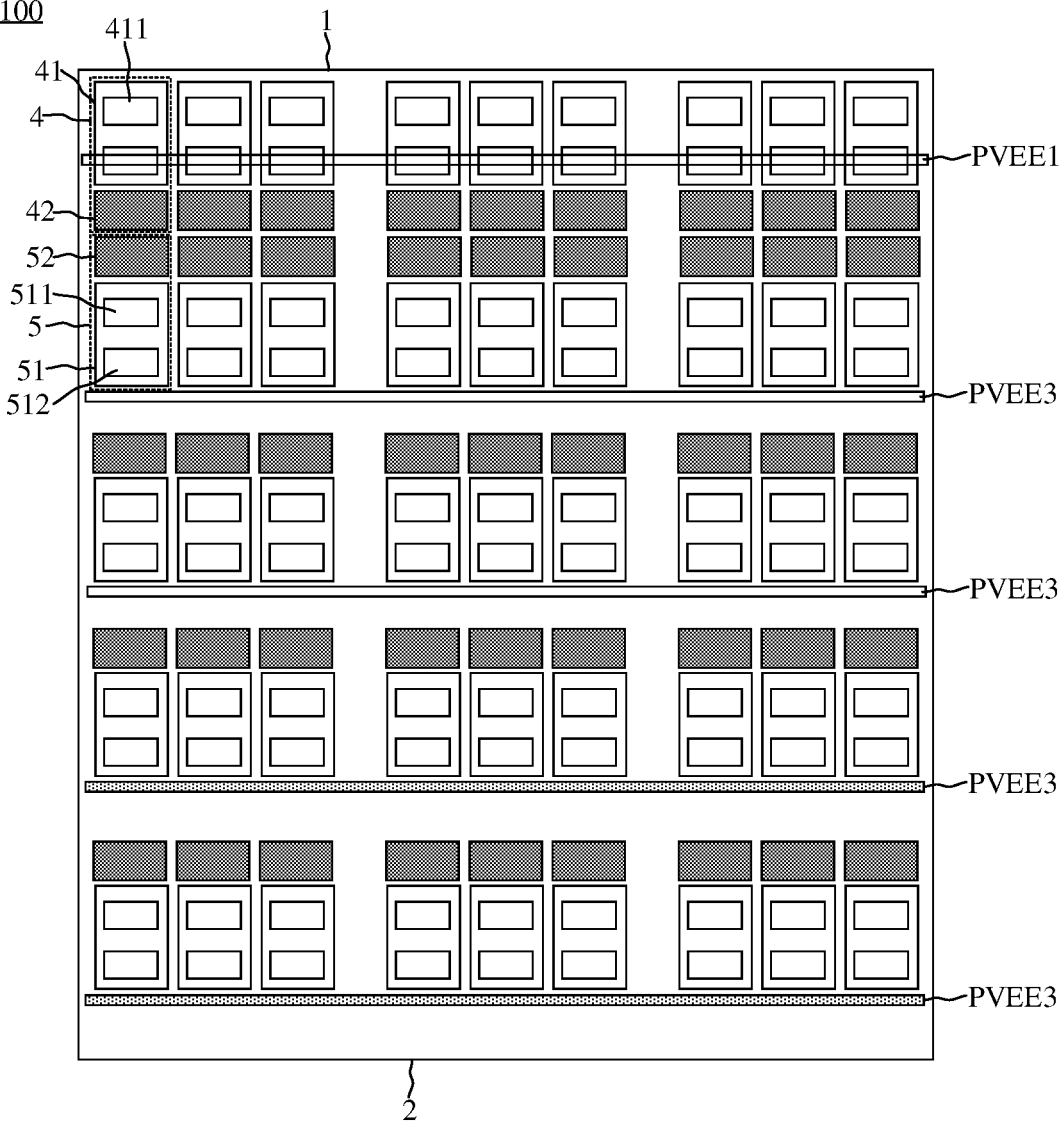
FIG. 11 is another top view of a display panel provided by some embodiments of the present disclosure.

FIG. 11 is another top view of the display panel 100 provided by some embodiments of the present disclosure. In some embodiments, in combination with FIG. 9 and FIG. 11, the anode 411 of the first light-emitting device 41 is electrically connected to the first pixel circuit 42 through a first connection part 10, a cathode 412 of the first light-emitting device 41 is electrically connected to the first negative power supply signal line PVEE1, and the anode 411 of the first light-emitting device 41 is located at a side of the cathode 412 of the first light-emitting device 41 away from the first pixel circuit 42.

The first edge 1 of the display panel 100 can be regarded as the upper edge of the display panel 100. The anode 411 of the first light-emitting device 41 is located at a side of the cathode 412 of the first light-emitting device 41 away from the first pixel circuit 42. That is, the anode 411 of the first light-emitting device 41 is closer to the upper edge of the display panel 100, which is consistent with the arrangement of the anode 511 and the cathode 512 in the second light-emitting device 52.

In a process of forming the display panel 100, the light-emitting devices grow on a growth substrate and then are transferred over in huge amounts, and the light-emitting devices growing on the growth substrate grow towards a same direction. In the embodiments of the disclosure, the arrangement direction of the anode and the cathode of the first light-emitting device 41 is the same as the arrangement direction of the anode and cathode of the second light-emitting device 51, thereby not needing to adjust the growing direction of the light-emitting devices growing on the growth substrate, moreover, the transferring in huge amounts is performed for binding without needing to perform operations on the light-emitting devices, such as reversing the light-emitting devices, thereby reducing the process complexity to a large extent.

Figure 12:
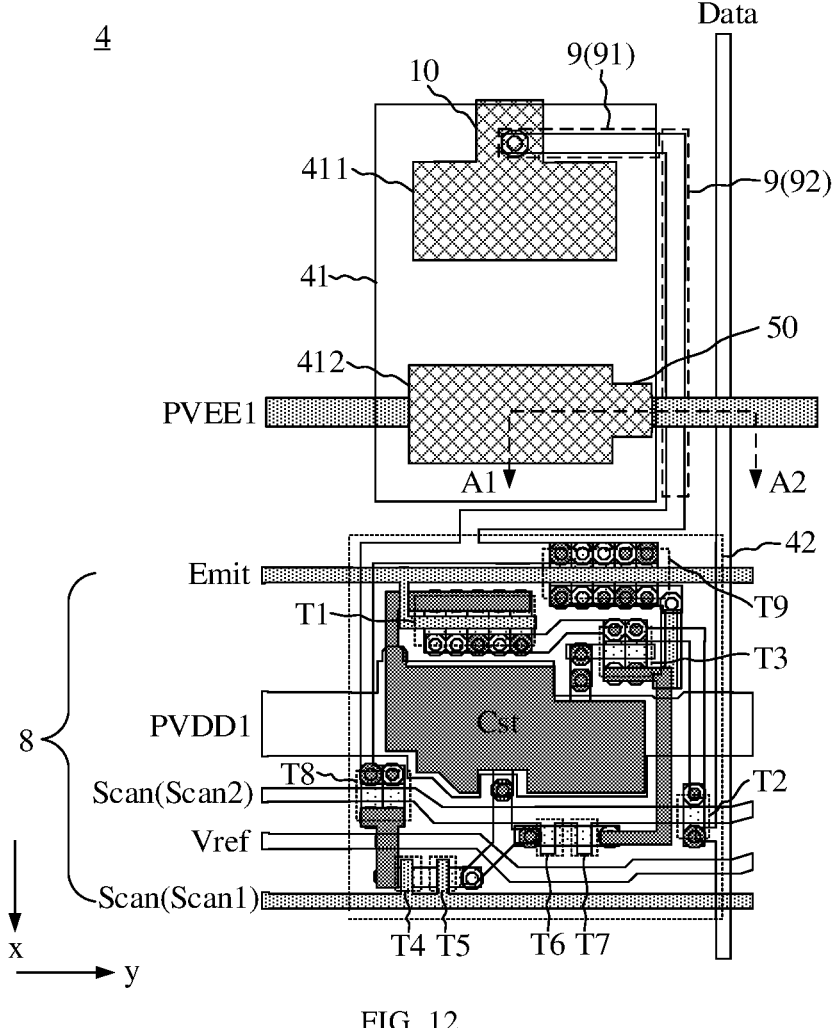
FIG. 12 is another layer schematic diagram of a first sub-pixel provided by some embodiments of the present disclosure.

FIG. 12 is a layer schematic diagram of the first sub-pixel 4 provided by some embodiments of the present disclosure. In some embodiments, combining FIG. 9 and FIG. 12, a first connection line 9 is provided between the first connection part 10 and the first pixel circuit 42, and is configured to connect the first connection part 10 and the first pixel circuit 42. The first connection line 9 includes a first line segment 91 and a second line segment 92 that are connected to each other. An end of the first line segment 91 is electrically connected to the first connection part 10, and at least a part of the first line section 91 extends along the second direction y. The second line section 92 extends at a side of the first light-emitting device 41 along the second direction y.

In some embodiments, referring to FIG. 9, the first line segment 91 first protrudes from an outer side of the first light-emitting device 41 in the first direction x and then extends laterally in the second direction y. In other embodiments, referring to FIG. 12, the first line segment 91 extends laterally directly in the second direction y. In this case, the first line segment 91 does not protrude from the outer side of the first light-emitting device 41 and will not take up an additional width in the first direction x, thereby freeing up more space at the outer side of the first light-emitting device 41 for the cutting operation and thus reducing the width of the upper bezel of the display panel 100.

Figure 13:
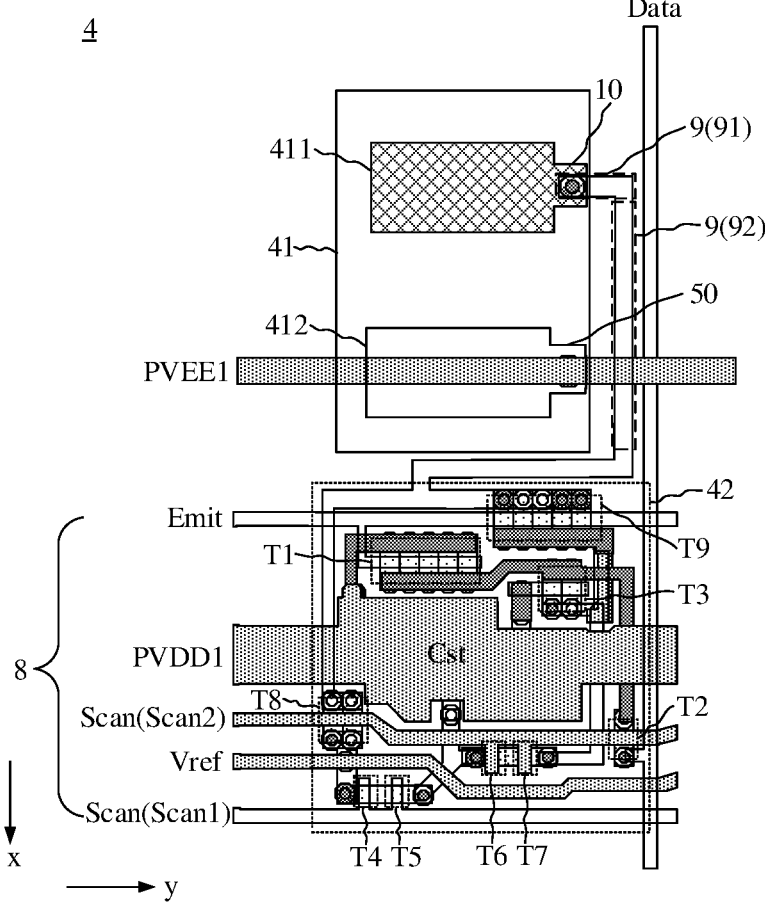
FIG. 13 is another layer schematic diagram of a first sub-pixel provided by some embodiments of the present disclosure.

FIG. 13 is a layer schematic diagram of the first sub-pixel 4 provided by some embodiments of the present disclosure. As shown in FIG. 13, the first line segment 91 extends along the second direction y, and the first connection part 10 is located at a side of the anode 411 of the first light-emitting device 41 in the second direction y.

In the above configuration, both the first line segment 91 and the first connection part 10 do not protrude from the outer side of the first light-emitting device 41 and will not take up an additional width in the first direction x, thus freeing up more cutting space at the outer side of the first light-emitting device 41 to further narrow the upper bezel.

Figure 14:
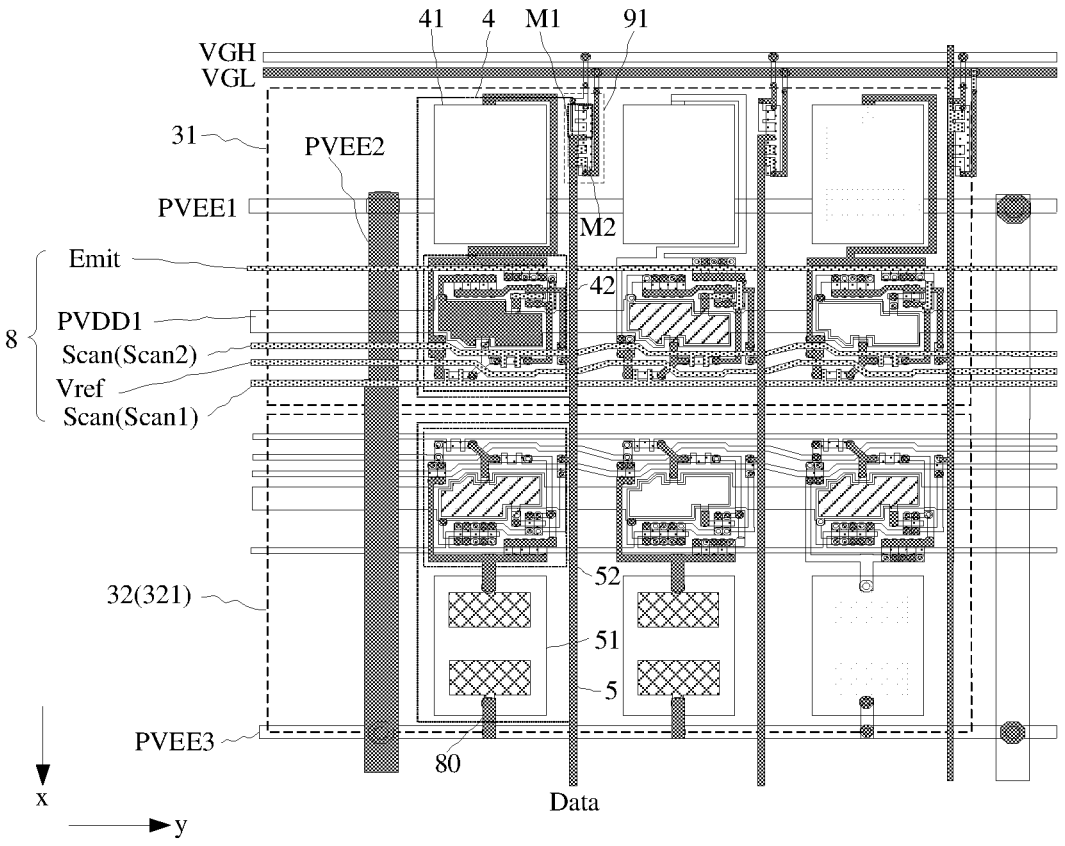
FIG. 14 is another top view of a display panel provided by some embodiments of the present disclosure.

FIG. 14 is a top view of a display panel provided by some embodiments of the present disclosure. In some embodiments, as shown in FIG. 14, the display panel can include an electrostatic protection circuit 91 configured to provide electrostatic protection to the display panel, and the electrostatic protection circuit 91 is located between two adjacent first light-emitting devices 41 in the second A pixel row 31.

In a structure, the electrostatic protection circuit 91 can include a first protective transistor M1 and a second protective transistor M2. The first protective transistor M1 is a P-type transistor, and a gate and a first electrode of the first protective transistor M1 are electrically connected to a first fixed-potential signal line VGH, and a second electrode of the first protective transistor M1 is electrically connected to the data line Data. The second protective transistor M2 is an n-type transistor, a gate and a first electrode of the second protective transistor M2 are electrically connected to a second fixed-potential signal line VGL, and a second electrode of the second protective transistor M2 is electrically connected to the data line Data.

In a conventional design, the electrostatic protection circuit 91 is generally arranged at the upper bezel of the display panel 100. That is, at a side of the first pixel row 31 close to the first edge 1. In the embodiments of the present disclosure, the electrostatic protection circuit 91 is arranged between two adjacent first light-emitting devices 41 in the second A pixel row 31, thereby saving the space occupied by the electrostatic protection circuit 91 on the upper bezel and thus reducing the cut width of the upper bezel.

In the layer design of the display panel, the second negative power supply signal line PVEE2 is located in a same layer with at least one connection line located between the first protective transistor M1 and the first fixed-potential signal line VGH, and is also located in a same layer with at least one connection line located between the second protective transistor M2 and the second fixed-potential signal line VGL, and the first negative power supply signal line PVEE1 is located in a same layer with the gate of the first protective transistor M1 and the gate of the second protective transistor M2.

For the first light-emitting device 41, if the cathode 412 of the first light-emitting device 41 is located at a side of the anode 411 of the first light-emitting device 41 close to the first edge 1, the first negative power supply signal line PVEE1 can also be located at the outer side of the first light-emitting device 41 accordingly, then the second negative power supply signal line PVEE2 can continuously extend to a side of the first light-emitting device 41 close to the first edge 1 when the second negative power supply signal line PVEE2 is connected to the first negative power supply signal line PVEE1. In this case, if the electrostatic protection circuit 91 is also provided at the upper bezel located at a side of the first pixel row 31 close to the first edge 1, a wiring position of the second negative power supply signal line PVEE2 may overlap with a wiring position of a connection line located between and connecting the first protective transistor M1 and the first fixed-potential signal line VGH and a wiring position of a connection line located between and connecting the second protective transistor M2 and the second fixed-potential signal line VGL, or a wiring position of the first negative power supply signal line PVEE1 may overlap with a wiring position of a gate of the first protective transistor M1 and a wiring position of a gate of the second protective transistor M2.

In the embodiments of the present disclosure, by arranging the anode 411 of the first light-emitting device 41 at a side of the cathode 412 of the first light-emitting device 41 close to the first pixel circuit 42, the position of the first negative power supply signal line PVEE1 can be adjusted accordingly to make the first negative power supply signal line PVEE1 overlap with the cathode 412 of the first light-emitting device 41 or make the first negative power supply signal line PVEE1 be located at a side of the first light-emitting device 41 close to the first pixel circuit 42. In this case, the second negative power supply signal line PVEE2 does not need to extend to a side of the first light-emitting device 41 close to the first edge 1. At the same time, by moving the electrostatic protection circuit 91 from the upper bezel to a position located between two adjacent first light-emitting devices 41 in the second A pixel row 31, it is possible to optimize or enhance the design of the position of the negative power supply signal line and the position of the electrostatic protection circuit 91. In this way, it can avoid that the negative power supply signal line and the electrostatic protection circuit 91 are short-circuited, or avoid that the wiring position of the negative power supply signal line overlaps with the electrostatic protection circuit 91, thereby optimizing the layout design, as well as avoiding short circuit between the lines and improving the electrostatic protection capability of the display panel.

In some embodiments, referring to FIG. 4 again, the first pixel circuit 42 and the second pixel circuit 52 located in the second A pixel row 321 are arranged in mirror symmetry in the first direction x.

When designing the layout of the pixel circuit, the ninth transistor T9 in the pixel circuit that is electrically connected to the anode of the light-emitting device is usually arranged close to the anode of the light-emitting device, so that a connection distance between the ninth transistor T9 and the anode can be reduced. In other words, if the anode of the light-emitting device is located at a lower side of the pixel circuit, the ninth transistor T9 in the pixel circuit is located at a lower position of the entire pixel circuit.

As described above, in the embodiments of the present disclosure, after the position of the first pixel circuit 42 is adjusted, the anode and the cathode of the first light-emitting device 41 are still oriented towards same directions as the anode and the cathode of the second light-emitting device 51, so that the anode 411 of the first light-emitting device 41 is located at a side of the cathode 412 away from the first pixel circuit 42 to avoid adjusting the orientation of the light-emitting device growing on the growth substrate, or to avoid operations performed on the light-emitting device during binding, such as reversing the light-emitting device. Thus, the first pixel circuit 42 and the second pixel circuit 52 in the second A pixel row 321 are arranged in mirror symmetry, which is equivalent to reversing the first pixel circuit 42 based on the first light-emitting device 41, thereby reducing a connection distance between the ninth transistor T9 in the first pixel circuit 42 and the anode 411 in the first light-emitting device 41. In this way, the signal attenuation can be reduced when the first pixel circuit 42 transmits the driving current to the first light-emitting device 41, thereby improving the accuracy of the light-emitting brightness of the first light-emitting device 41. Moreover, the space occupied by the connection line between the first pixel circuit 42 and the first light-emitting device 41 can be saved.

In some embodiments, referring to FIG. 3 again, a distance d1 between the edge of the first light-emitting device 41 and the edge of the second light-emitting device 51 in the second A pixel row 321 and a distance d2 between the edges of the second light-emitting devices 51 respectively located in two adjacent second pixel rows 32 satisfy: d1=d2. In the process of forming the display panel, taking into account the process error, d1=d2 herein can mean that a difference between d1 and d2 is within a range of ±50 μm. That is, it is can be regarded as that d1=d2 when |d1−d2|≤50 μm.

Such a configuration can be regarded as not changing the position of the first light-emitting device 41, and in this case, a distance between the first light-emitting device 41 and the second light-emitting device 51 in the second A pixel line 321 is still equal to a distance between the second light-emitting device 51 in any two adjacent second pixel rows 32. The light-emitting devices in different pixel rows 3 of the display panel 100 are equally spaced apart from each other, and the display panel 100 has better display uniformity.

Figure 15:
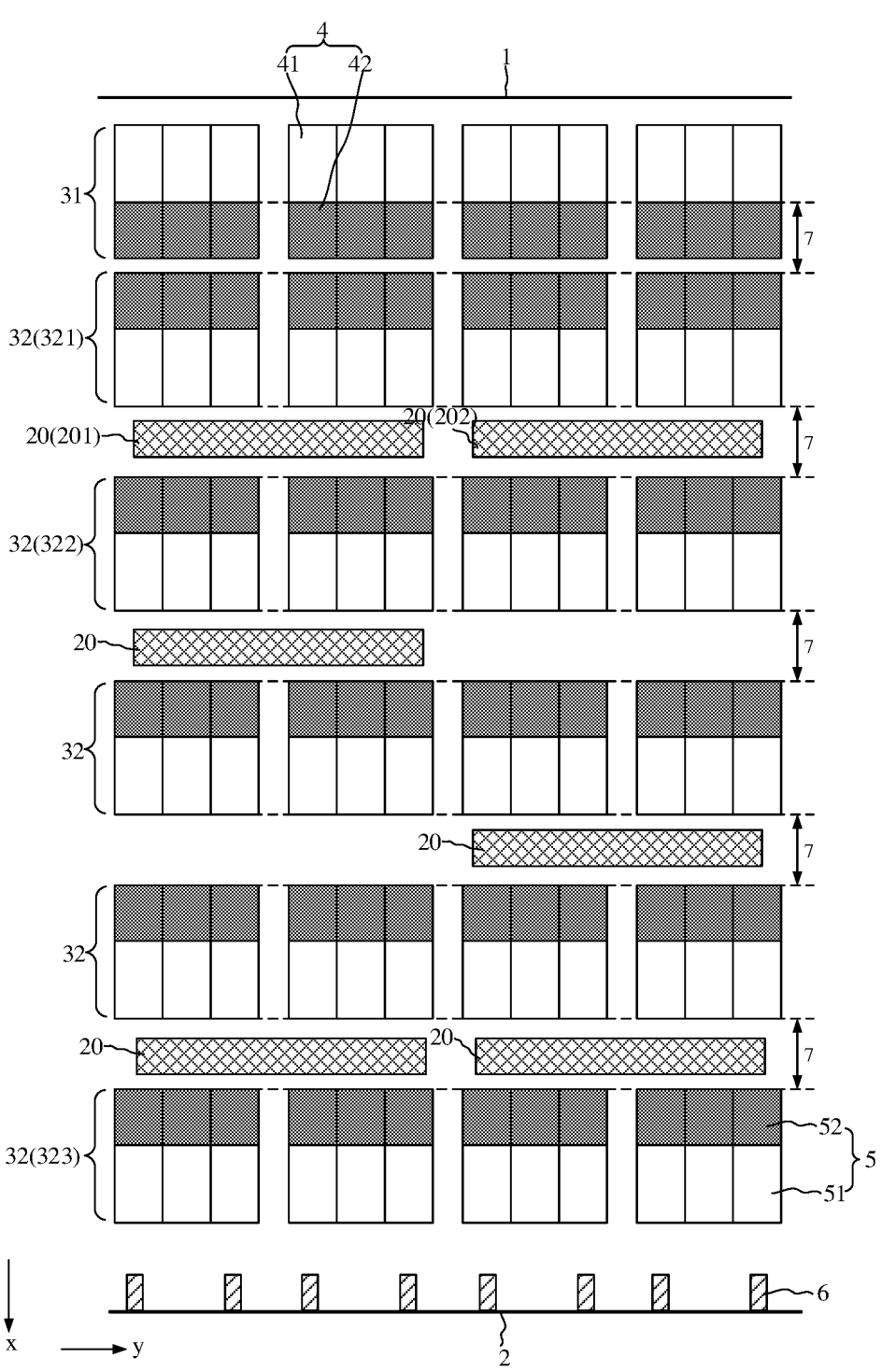
FIG. 15 is a schematic diagram showing a position of a shift register provided by some embodiments of the present disclosure.

FIG. 15 is a schematic diagram showing a position of a shift register 20 provided by some embodiments of the present disclosure. In some embodiments, as shown in FIG. 15, the display panel 100 also includes multiple cascaded shift registers 20 located in at least one first spacing region 7. Exemplarily, the display panel 100 can include multiple first shift registers electrically connected to multiple first scanning signal lines Scan1, multiple second shift registers electrically connected to multiple second scanning signal lines Scan2, and multiple third shift registers electrically connected to multiple light-emitting control signal lines Emit. Each of the cascaded shift registers 20 is configured to sequentially output an enable level, and the signal line electrically connected to the shift register 20 transmits the enable level to the first pixel circuit 42 or the second pixel circuit 52 to control normal operation of the first pixel circuit 42 or the second pixel circuit 52.

In the embodiments of the present disclosure, the first spacing region 7 located between two adjacent pixel rows 3 can be configured to accommodate the shift register 20. In other words, the first spacing region 7 is provided between two adjacent pixel rows 3, so that a space for arranging the shift register 20 in the display region can be reserved to enable the shift register 20 to be disposed between the second pixel rows 3, thereby disposing the shift register 20 in the display region of the display panel 100. In this way, the shift registers 20 do not occupy the space at the left and right bezels, so that the display panel 100 can have an ultra-narrow left bezel and an ultra-narrow right bezel or even have no left bezel and no right bezel. Moreover, s distance between two adjacent light-emitting devices in the two display panels 100 adjacent in the second direction y when the display panels are applied in the spliced display device, thereby weakening the visual splicing gap extending in the first direction x.

In some embodiments, referring to FIG. 4 again, the anode 511 of the second light-emitting device 51 is electrically connected to the second pixel circuit 52, and the cathode 512 of the second light-emitting device 51 is electrically connected to a third negative power supply signal line PVEE3 located in the first spacing region 7 located at a side of the second light-emitting device 51 away from the first pixel row 31.

In the embodiments of the disclosure, the first spacing region 7 provided between two adjacent pixel rows 3 can also be used to accommodate the third negative power supply signal line PVEE3. As described above, the cathode 512 of the second light-emitting device 51 is located at a side of the anode 511 away from the first pixel row 31, and the third negative power supply signal line PVEE3 is arranged in the first spacing region 7 located at a side of the second pixel row 32, in which the second light-emitting device 51 electrically connected to the third negative power supply signal line PVEE3 is located, away from the first pixel row 31, so that the third negative power supply signal line PVEE3 is arranged closer to the cathode 512 of the second light-emitting device 51. In this way, a connection distance is smaller, thereby facilitating electrical connection between the third negative power supply signal line PVEE3 and the second light-emitting device 51.

Figures 16, 17:
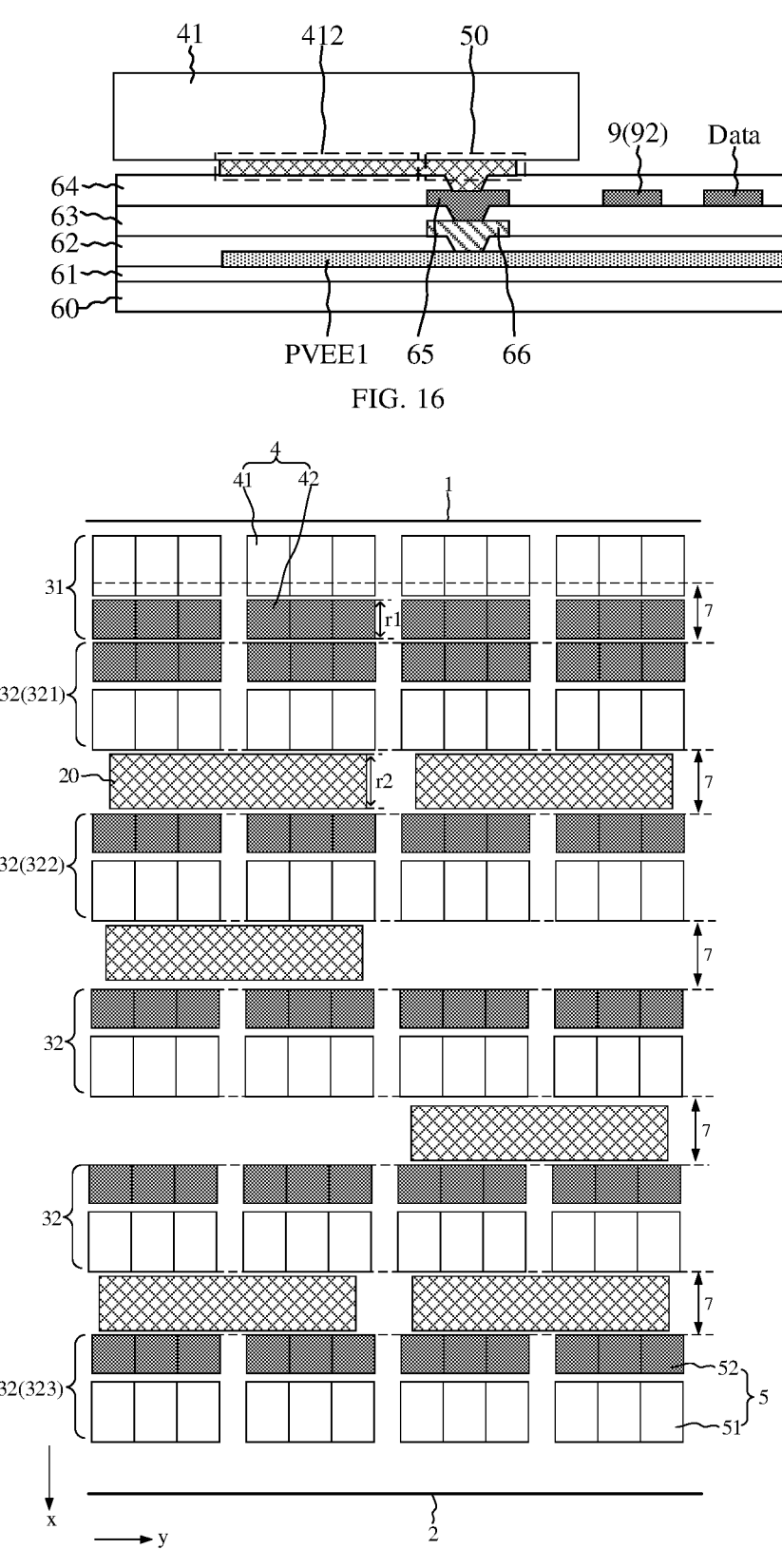
FIG. 16 is a sectional view along A1-A2 shown in FIG. 12 according to an embodiment of the present disclosure.
FIG. 17 is another top view of a display panel provided by some embodiments of the present disclosure.

FIG. 16 is a sectional view along A1-A2 shown in FIG. 12. In some embodiments, combining FIG. 4, FIG. 12 and FIG. 16, the anode 411 of the first light-emitting device 41 is electrically connected to the first pixel circuit 42, and the cathode 412 of the first light-emitting device 41 is electrically connected to the first negative power supply signal line PVEE1 extending along the second direction y. In the direction perpendicular to the plane of the display panel 100, the first negative power supply signal line PVEE1 overlaps with the first light-emitting device 41, for example, the first negative power supply signal line PVEE1 may overlap with the cathode 412 of the first light-emitting device 41.

Referring to FIG. 4, the second light-emitting device 51 is electrically connected to the third negative power supply signal line PVEE3, and the third negative power supply signal line PVEE3 is located at a side of the second light-emitting device 51. The second light-emitting device 51 is electrically connected to the third negative power supply signal line PVEE3 through the connection line 80 extending along the first direction x. In this case, the connection line 80 and the third negative power supply signal line PVEE3 each take up additional space in the first direction x.

In the embodiments of the present disclosure, the first negative power supply signal line PVEE1 overlaps with the first light-emitting device 41, the cathode 412 of the first light-emitting device 41 can be directly connected to the first negative power supply signal line PVEE1 through a second connection part 50 located at a side of the cathode 412, and there is no need to provide an additional connection line between the second connection part 50 and the first negative power supply signal line PVEE1, thus saving a space occupied by the connection line and the first negative power supply signal line PVEE1 in the first direction x. A line width of the power supply signal line in the display panel 100 is much larger than a line width of other signal line, and thus more space can be freed up for accommodating the first pixel circuit 42 in the first spacing region 7 corresponding to the second A pixel row 321, so that the first pixel circuit 42 is properly accommodated between the first light-emitting device 41 and the second light-emitting device 51 in the second A pixel row 321.

Referring to FIG. 16, the display panel 100 includes a substrate 60, a buffer layer 61 disposed at a side of the substrate 60, a gate insulating layer 62 disposed at a side of the buffer layer facing away from the substrate 60, an interlayer insulating layer 63 disposed at a side of the gate insulating layer 62 facing away from the substrate 60, and a planarization layer 64 disposed at a side of the interlayer insulating layer 63 facing away from the substrate 60. The first negative power supply signal line PVEE1 can be located between the buffer layer 61 and the gate insulating layer 62. The second connection part 50 can be electrically connected to the first negative power supply signal line PVEE1 through a first auxiliary connection part 65 located between the planarization layer 64 and the interlayer insulating layer 63 and a second auxiliary connection part 66 located between the interlayer insulating layer 63 and the gate insulating layer 62, so as to improve the reliability of the connection between the second connection part 50 and the first negative power supply signal line PVEE1.

FIG. 17 is a top view of the display panel 100 provided by some embodiments of the present disclosure. In some embodiments, as shown in FIG. 17, the display panel 100 includes multiple cascaded shift registers 20, and the shift registers 20 are disposed in at least one first spacing region 7. The first pixel circuit 42 has a size r1 in the first direction x, the shift register 20 has a size r2 in the first direction x, and r1<r2. A part of the first light-emitting device 41 is located in the first spacing region 7 corresponding to the second A pixel row 321.

The size r1 of the first pixel circuit 42 in the first direction x is smaller than the size r2 of the shift register 20 in the first direction x. Therefore, a longitudinal width occupied by the first pixel circuit 42 in the first spacing region 7 is smaller, and a position of the first light-emitting device 41 can be further adjusted, for example, the first light-emitting device 41 is moved towards the second light-emitting device 51, so that a part of the first light-emitting device 41 is located in the first spacing region 7 corresponding to the second A pixel row 321. That is, a distance between the first light-emitting device 41 and the second light-emitting device 51 in the second A pixel row 321 is reduced, to free up a larger cut width of the upper bezel.

Because the above-mentioned configuration can narrow the upper bezel, a width of the lower bezel of the display panel 100 can be compensated without increasing the design size of the display panel 100, and such a configuration is more suitable for the display panel 100 that requires the lower bezel having a larger width. For example, if the number of pins 6 in the display panel 100 is large, the pins 6 take up a large space at the lower bezel. Although the above-mentioned configuration may slightly change a distance between the first light-emitting device 41 and the second light-emitting device 51 adjacent to the first light-emitting device 41, a larger cut width of the upper bezel can be freed up to compensate the width of the lower bezel, thereby providing enough space for accommodating pins at the lower bezel while weakening the visual splicing gap.

In some embodiments, referring to FIG. 15 again, the display panel 100 includes multiple cascaded shift registers 20, and the shift registers 20 are located in at least one first spacing region 7 at a side of the second A pixel row 321 away from the first pixel row 31.

In the embodiments of the present disclosure, the first spacing region 7 located between two adjacent pixel rows 3 can be used to accommodate the shift register 20. This configuration disposes the shift register 20 in the display region of the display panel 100 and avoiding that the shift register 20 occupies the space at the left and right bezels. In this regard, the display panel 100 can have an ultra-narrow left bezel and an ultra-narrow right bezel or even have no left bezel and no right bezel. Moreover, s distance between two adjacent light-emitting devices in the two display panels 100 adjacent in the second direction y when the display panels are applied in the spliced display device, thereby weakening the visual splicing gap extending in the first direction x.

In the embodiments of the present disclosure, the shift register 20 is arranged in the first spacing region 7 at a side of the second A pixel row 321 away from the first pixel row 31, thereby avoiding that the shift register 20 and the first pixel circuit 42 occupy the space of a same first spacing region 7, so that there is enough space for accommodating each of the shift register 20 and the first pixel circuit 42. In this way, the layout design of the first pixel circuit 42 and the shift register 20 is enhanced. Further, the noted arrangement prevents or limits the first light-emitting device 41 in the first pixel line 31 and the second light-emitting device 51 in the second A pixel line 321 from being too far apart from each other, thereby facilitating the overall uniform arrangement of the light-emitting devices and improving the display uniformity. Such a configuration can also achieve a reasonable use of the first spacing region 7, which can be better combined with the solution where the upper bezel is narrowed by adjusting the position of the first pixel circuit 42.

Referring to FIG. 15 again, the second pixel row 32 also includes a second B pixel row 322 adjacent to the second A pixel row 321. The shift registers 20 include a first shift register 201 electrically connected to the first pixel row 31 and a second shift register 202 electrically connected to the second A pixel row 321, and the first shift register 201 and the second shift register 202 are located in the first spacing region 7 corresponding to the second B pixel row 322. That is, located in the first spacing region 7 between the second A pixel row 321 and the second B pixel row 322.

When the shift register 20 is arranged in the first spacing region 7, in order to reduce a distance between the shift register 20 and the pixel row 3 corresponding to the shift register 20, the shift register 20 can be arranged in the first spacing region 7 that is closer to the pixel row 3. For the first shift register 201 electrically connected to the first pixel row 31 and the second shift register 202 electrically connected to the second A pixel row 321, by arranging the first shift register 201 and the second shift register 202 in the first spacing region 7 corresponding to the second B pixel row 322, it can avoid that the first shift register 201 and the second shift register 202 occupy the space for accommodating the first pixel circuit 42. Moreover, it can avoid that a distance between each of the first-stage shift register 201 and the second-stage shift register 202 and the pixel row 3 electrically connected thereto from being too far from each other. In this way, a voltage drop of the signal during transmission can be reduced.

In some embodiments, referring to FIG. 15 again, the display panel 100 includes multiple cascaded shift registers 20, the second pixel row 32 includes a second C pixel row 323 adjacent to the second edge 2, and the shift registers 20 are located in at least one first spacing region 7 at a side of the second C pixel row 323 away from the second edge 2.

In the above-mentioned configuration, the shift register 20 does not occupy the space at the outer side (a side close to the second edge 2) of the second C pixel row 323. In another configuration, the space that would be reserved for accommodating the shift register 20 at the lower bezel can be cut off to reduce the width of the lower bezel, thereby weakening the visual splicing gap. In another configuration, the space that would be reserved for accommodating the shift register 20 at the lower bezel can also be used to accommodate the pins 6, thereby optimizing the arrangement of the pins 6 and reducing signal interference.

Two shift registers 20 can be arranged in at least one first spacing region 7 when the shift register 20 is located at a side of the second A pixel row 321 away from the first pixel row 31 and is also located at a side of the second C pixel row 323 away from the second edge 2.

Figure 18:
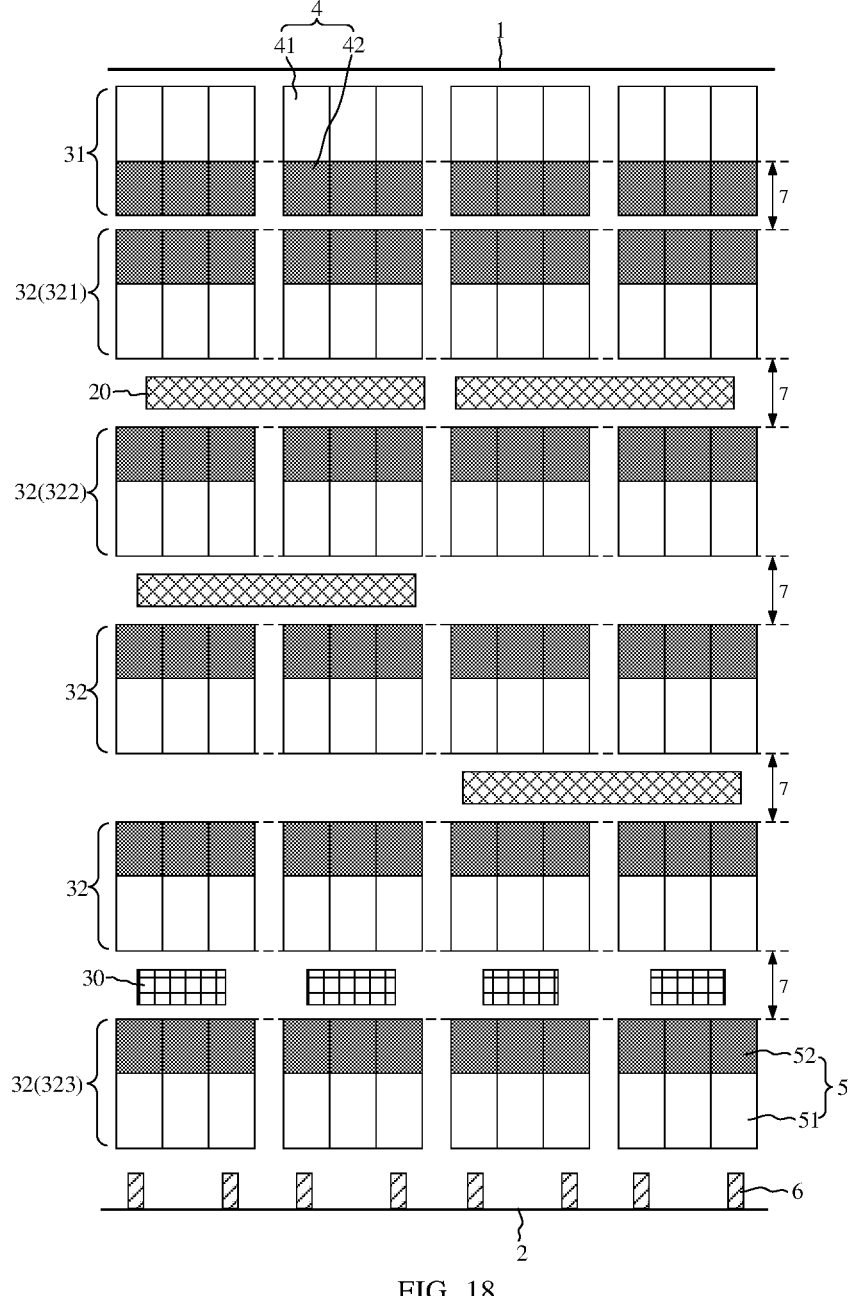
FIG. 18 is a schematic diagram showing a position of a gate circuit provided by some embodiments of the present disclosure.
Figure 19:
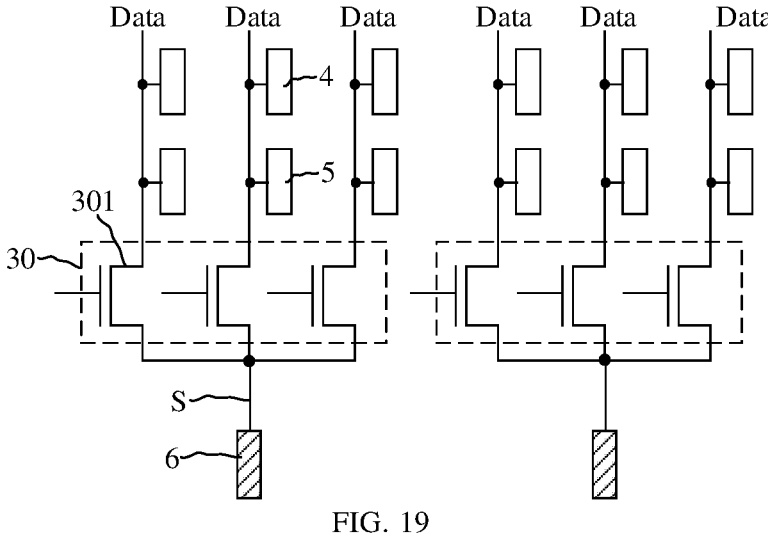
FIG. 19 is a schematic diagram of a gate circuit provided by some embodiments of the present disclosure.

FIG. 18 is a schematic diagram showing a position of a gate circuit 30 provided by some embodiments of the present disclosure, and FIG. 19 is a schematic diagram of the gate circuit 30 provided by some embodiments of the present disclosure. In some embodiments, as shown in FIG. 18 and FIG. 19, the display panel 100 includes a gate circuit 30 electrically connected to the first sub-pixel 4 and the second sub-pixel 5 via the data line Data. The second pixel row 32 includes a second C pixel row 323 adjacent to the second edge 2, and the gate circuit 30 is located in at least one first spacing region 7 at a side of the second C pixel row 323 away from the second edge 2.

In a configuration, as shown in FIG. 19, the gate circuit 30 includes multiple gate switches 301, and multiple gate switches 301 in one gate circuit 30 are electrically connected to a same source signal line S and are electrically connected to multiple data lines, respectively. By controlling the gate switches 301 in the gate circuit 30 to be tuned on in a time-division manner, the data voltage provided by the source signal line S can be written into different data lines in a time-division manner. The gate circuit 30 can reduce the number of the pins 6 required at the lower bezel, thereby reducing the space required for accommodating pins 6 at the lower bezel.

Conventionally, the gate circuit 30 is usually located at the lower bezel of the display panel 100. In the embodiments of the present disclosure, by arranging the gate circuit 30 in the first spacing region 7, the gate circuit 30 no longer occupies the space at the outer side (a side close to the second edge 2) of the second C pixel row 323. In an embodiment of the present disclosure, the space that would be reserved for accommodating the gate circuit 30 at the lower bezel can be cut off, thereby reducing the width of the lower bezel and thus weakening the visual splicing gap. In another embodiment of the present disclosure, the space that would be reserved for accommodating the gate circuit 30 can be configured to accommodate the pins 6, thereby optimizing the arrangement of the pins 6 and thus reducing the signal interference.

In some embodiments, referring to FIG. 18, the gate circuit 30 can be provided in the first spacing region 7 corresponding to the second C pixel row 323. In this case, the gate circuit 30 is closer to the pin 6, thereby reducing an extension length of the source signal line S electrically connected between the gate circuit 30 and the pin 6, and thus reducing a voltage drop of the data voltage.

In the embodiment of the present disclosure, referring to FIG. 18, the shift register 20 can be provides in the first spacing region 7 at a side of the second pixel row 32, adjacent to the second C pixel row 323, away from the second C pixel row 323, thereby avoiding that the shift register 20 and the gate circuit 30 from occupy the space of a same first spacing region 7. In this way, there is enough space accommodate each of the shift register 20 and the gate circuit 30, thereby optimizing or enhancing the layout design of the gate circuit 30 and the shift register 20, and also avoiding or reducing a large distance between the last two second pixel rows 32. Such a configuration facilitates an overall uniform arrangement of light-emitting devices in the display panel 100.

Figure 20:
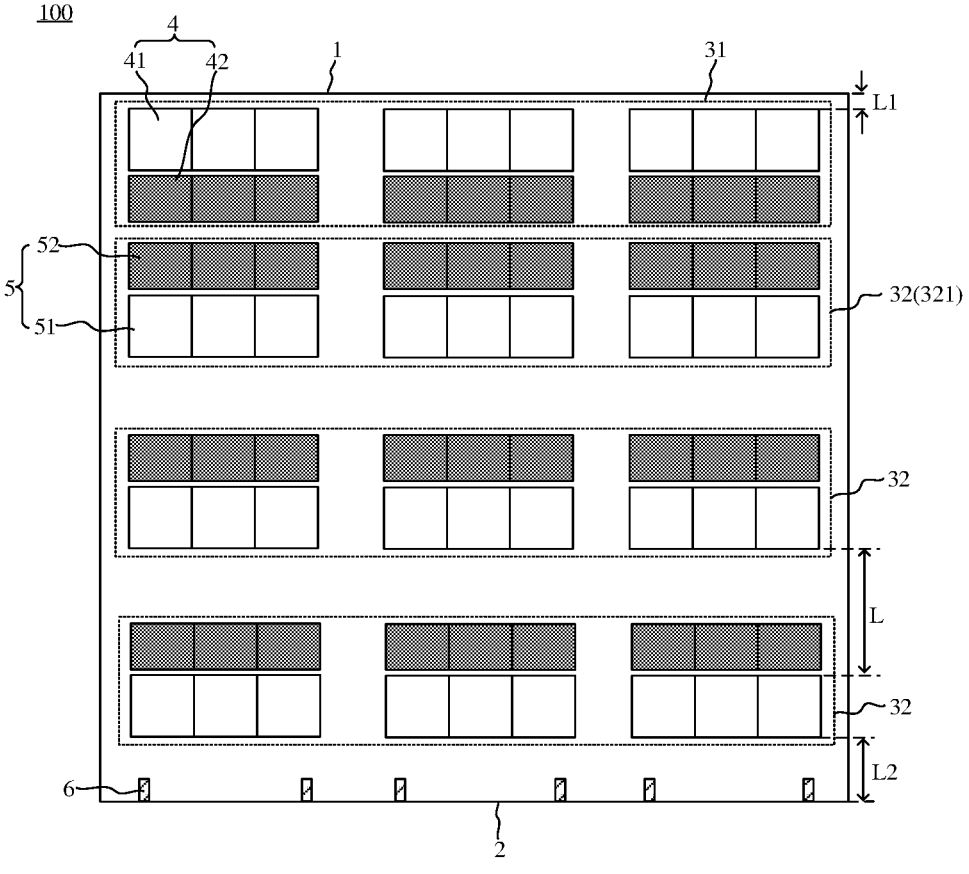
FIG. 20 is another top view of a display panel provided by some embodiments of the present disclosure.
Figure 21:
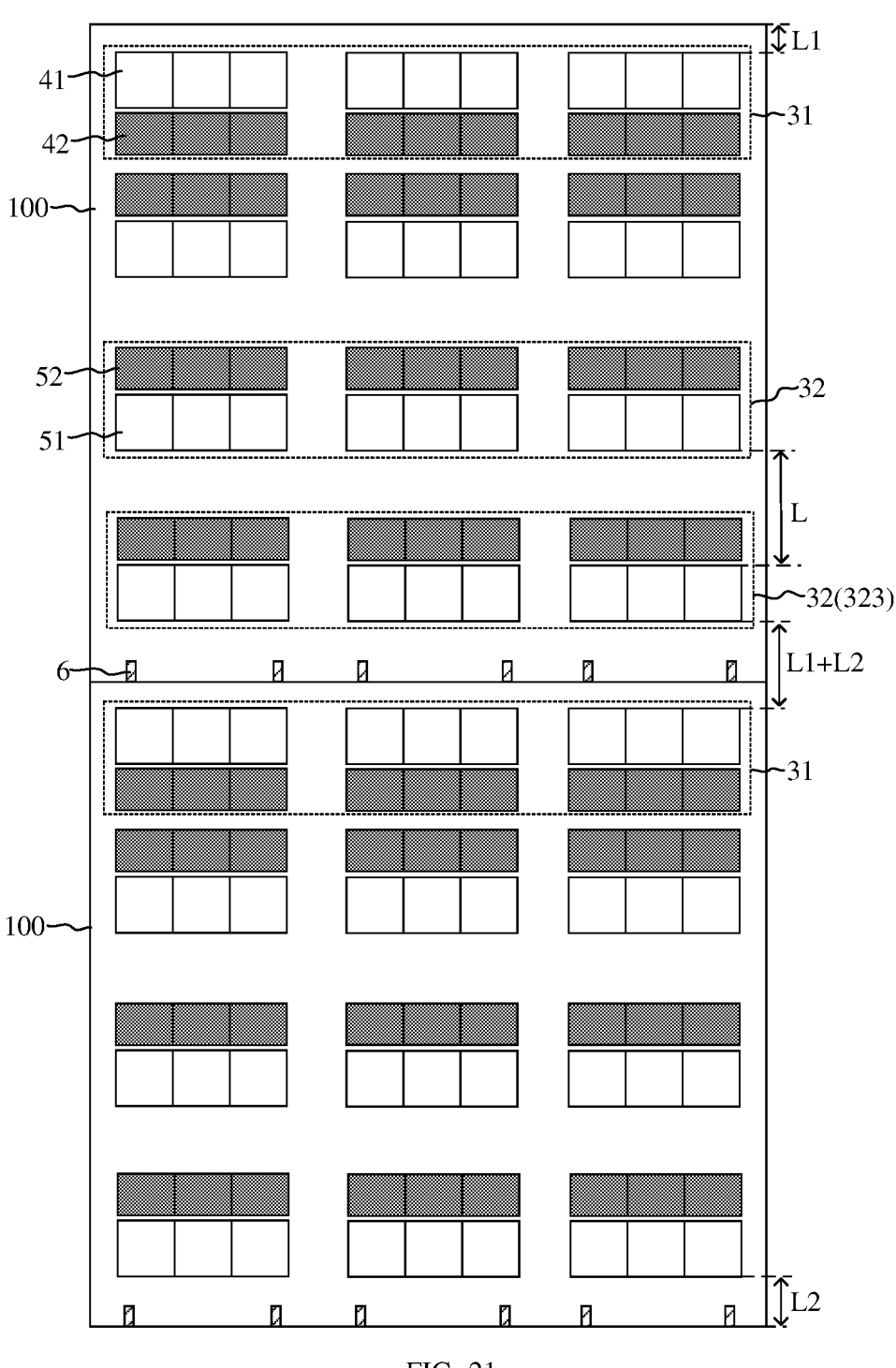
FIG. 21 is another top view of a spliced display device provided by some embodiments of the present disclosure.

FIG. 20 is another top view of the display panel 100 provided by some embodiments of the present disclosure, and FIG. 21 is another top view of a spliced display device provided by some embodiments of the present disclosure. In some embodiments, as shown in FIG. 20 and FIG. 21, a distance L1 between the first edge 1 and an edge of the first light-emitting device 41, a distance L2 between the second edge 2 and an edge of the second light-emitting device 51 closest to the second edge 2, and a distance L between edges of the second light-emitting devices 51 in two adjacent second pixel rows 32 satisfy L1+L2≤L.

In some embodiments, L1+L2=L.

In this configuration, for two display panels 100 adjacent to each other along the first direction x in the spliced display device, a distance between the second light-emitting device 51 in the second C pixel row 323 in the former display panel 100 and the first light-emitting device 41 in the first pixel row 31 in the latter display panel 100 is equal to a distance between the second light-emitting devices 51 in two adjacent second pixel rows 32 in a same display panel 100. In this way, the arrangement of the overall light-emitting devices in the spliced display device is more uniform, and the spliced display device realizes seamless splicing, thus eliminating the visual splicing gap.

In some embodiments, L1+L2<L.

When (L1+L2) is not equal to L, (L1+L2) is set to be smaller than L rather than being greater than L because of the following reasons. On the one hand, in some cases, when splicing the display panels 100 to form a spliced display device, an adhesive layer can be provided between the display panels 100 the to make display panels 100 be bonded and fixed to each other, to improve the reliability of the splicing, and, the adhesive layer can also avoid optical problems such as refraction caused by the air in the gap between the panels. Therefore, by setting (L1+L2) to be smaller than L, fluctuations in terms of the design size and the process accuracy of the adhesive layer can be provided. Even if there is an error in terms of the bezel width or the process accuracy, a difference between L and a distance between the second light-emitting device 51 in the second C pixel row 323 in the former display panel 100 and the first light-emitting device 41 in the first pixel row 31 in the latter display panel 100 will not be too large. On the other hand, since the space, having a width of (L1+L2), between the second light-emitting device 51 in the second C pixel row 323 in the former display panel 100 and the first light-emitting device 41 in the first pixel row 31 in the latter display panel 100 is a non-display region, and the wider the space, the non-display region will be more easily visible to the human eyes, a configuration where (L1+L2) is set to be smaller than L in the embodiments of the present disclosure can make the width of the space smaller. This reduces a risk that the splicing gap between the display panels 100 is visible by human eyes.

Figure 22:
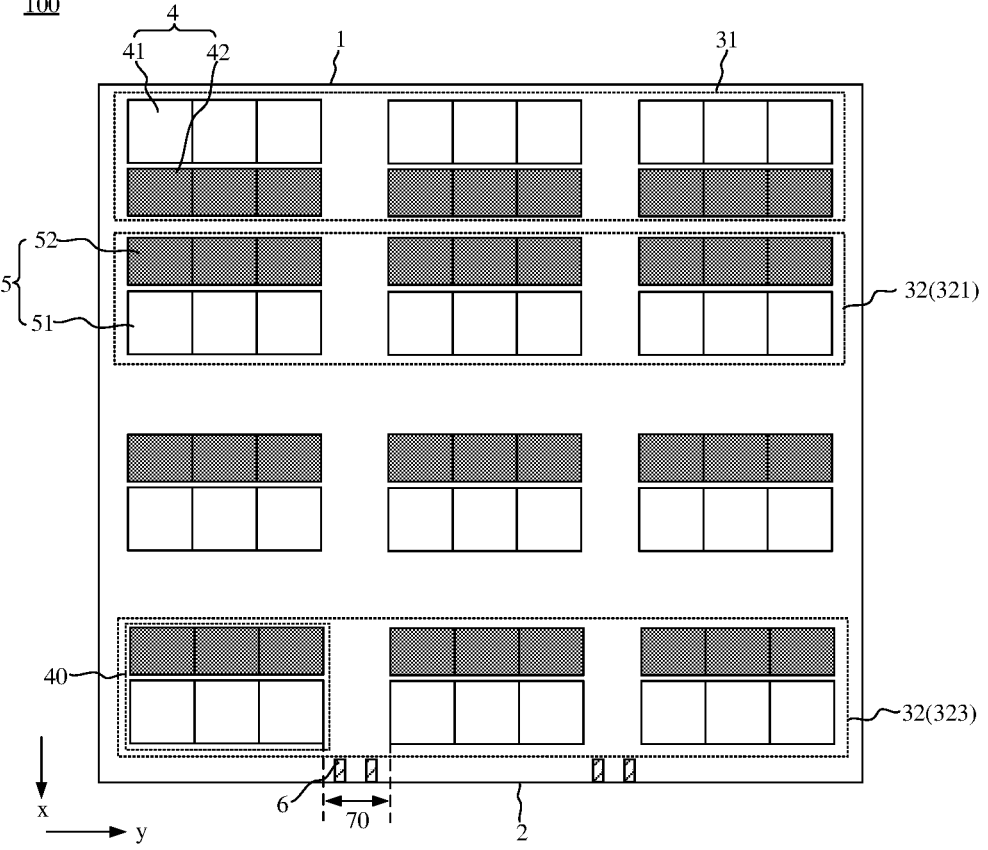
FIG. 22 is another top view of a display panel provided by some embodiments of the present disclosure.

FIG. 22 is another top view of the display panel 100 provided by some embodiments of the present disclosure. In some embodiments, as shown in FIG. 22, the second pixel rows 32 include a second C pixel row 323 adjacent to the second edge 2, the second C pixel row 323 includes multiple pixel units 40 arranged along the second direction y, and the pixel unit 40 includes multiple second sub-pixels 5 arranged along the second direction y. For example, the pixel unit 40 includes a second sub-pixel 5 configured to emit red light, a second sub-pixel 5 configured to emit green light, and a second sub-pixel 5 configured to emit blue light. A distance between two adjacent pixel units 40 can be greater than a distance between two adjacent second sub-pixels 5 in the pixel unit 40.

A second spacing region 70 is provided between two adjacent pixel units 40 in the second C pixel row 323. The display panel 100 includes pins 6 close to the second edge 2, and the pin 6 overlaps with the second spacing region 70 in the first direction x.

If the pin 6 is arranged directly below the pixel unit 40, the pin 6 overlaps with the pixel unit 40 in the first direction x. When the line is led from the pin 6 along the first direction x, in order to avoid a short circuit between this line and a line led from the second light-emitting device 51, the pin 6 may be spaced apart from the pixel unit 40 with a certain distance, which results in a requirement for a larger width of the lower bezel of the display panel 100. In the above-mentioned configuration, the pin 6 is arranged below the second spacing region 70, a risk of a short circuit between the line electrically connected to the pin 6 and an electrode of the second light-emitting device 51 can be reduced. In this case, the pin 6 can be moved a bit towards the first edge 1, thus reducing the design requirement for the width of the lower bezel, thereby narrowing the width of the lower bezel of the display panel 100 or compensating the width of the lower bezel of the display panel 100 by a smaller amount.

Figure 23:
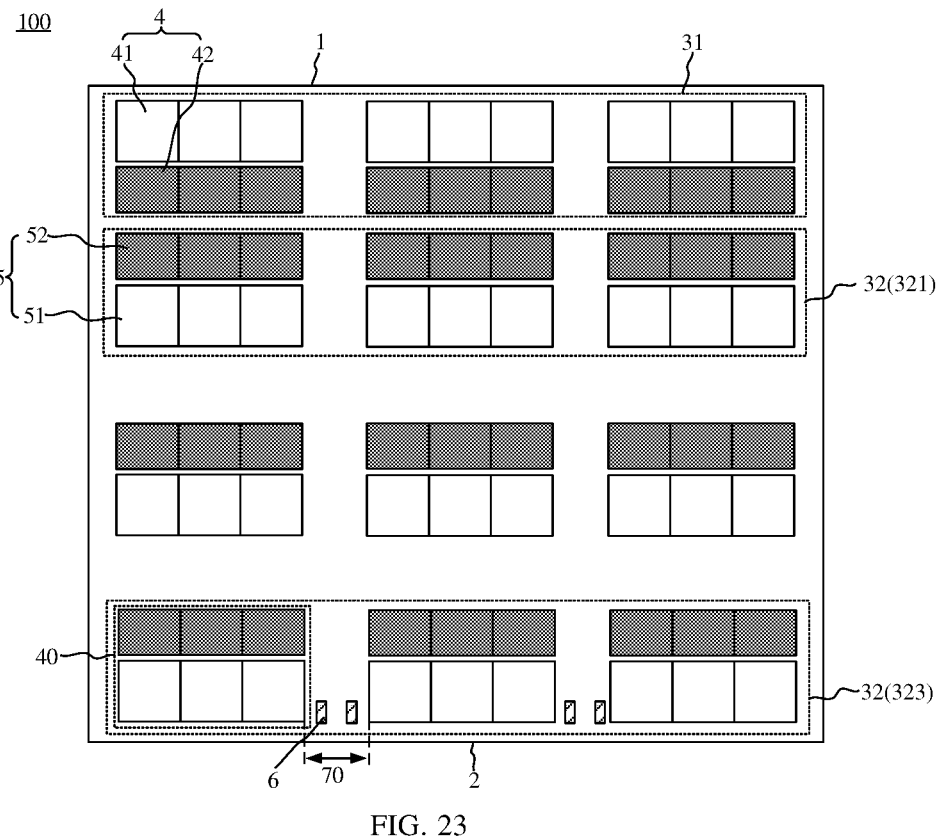
FIG. 23 is another top view of a display panel provided by some embodiments of the present disclosure.

FIG. 23 is a top view of the display panel 100 provided by some embodiments of the present disclosure. As shown in FIG. 23, at least part of the pins 6 can be located in the second spacing region 70.

When at least part of the pins 6 is located in the second spacing region 70, it is equivalent to arrange at least part of the pins 6 within the display region, thereby narrowing the lower bezel to a greater degree. With such a configuration, the data line Data or the source signal line S can be directly connected to the pin 6 in the display region without providing the fan-out line at the lower bezel, thereby saving the space for accommodating the fan-out lines at the lower bezel and narrowing the lower bezel, and thus further eliminating the visual splicing gap when the display panel 100 is applied in the spliced display device.

Figure 24:
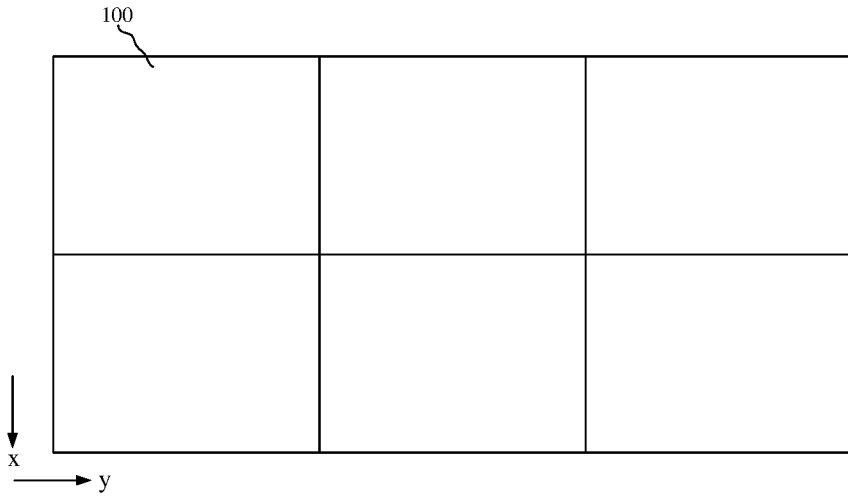
FIG. 24 is a schematic diagram of a spliced display device provided by some embodiments of the present disclosure.

Some embodiments of the present disclosure provide a spliced display device. FIG. 24 is a schematic diagram of a spliced display device provided by some embodiments of the present disclosure. In some embodiments, as shown in FIG. 24, the spliced display device includes at least two display panels 100 described above, and the at least two display panels 100 are spliced along the first direction x. A structure of the display panel 100 has been described in detail in the above embodiments, and will not be repeated herein. The spliced display device shown in FIG. 24 is only a schematic illustration, and the spliced display device can be, for example, an LED splicing screen, a movie screen, a remote viewing electronic product, etc.

Figure 25:
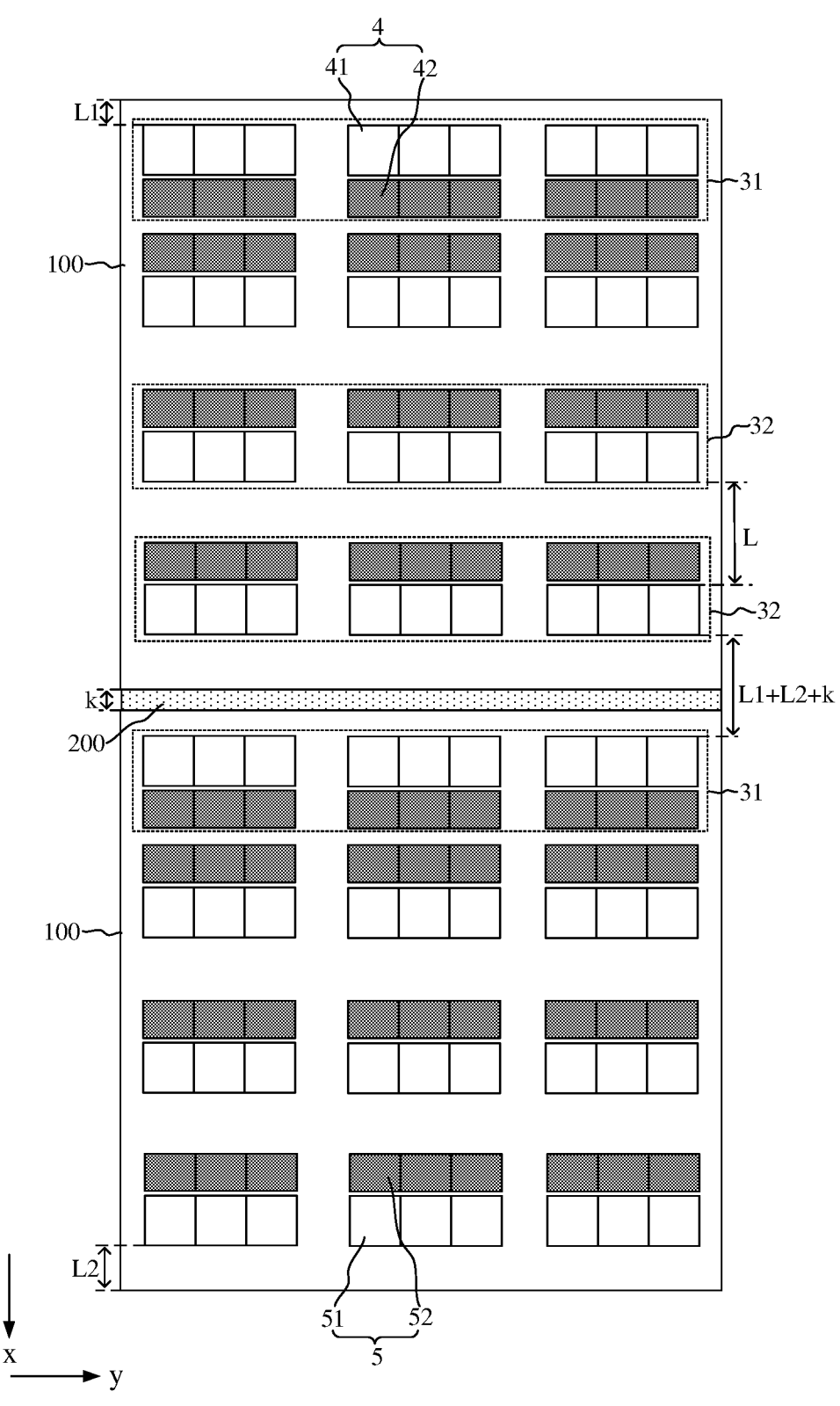
FIG. 25 is another schematic diagram of a spliced display device provided by some embodiments of the present disclosure.

FIG. 25 is another schematic diagram of a spliced display device provided by some embodiments of the present disclosure. In some embodiments, as shown in FIG. 25, the spliced display device also includes a first adhesive layer 200 located between two display panels 100 adjacent to each other in the first direction x. The first adhesive layer 200 has a width k in the first direction x. In the display panel 100, a distance L1 between the first edge 1 and an edge of the first light-emitting device 41, a distance L2 between the second edge 2 and an edge of the second light-emitting device 51 closest to the second edge 2, and a distance between edges of the second light-emitting devices 51 respectively located in two adjacent second pixel rows 32 satisfy: L1+L2+k≤L.

By providing the first adhesive layer 200 between the display panels 100, the first adhesive layer 200 can be used to bond the display panels 100 to improve the splicing reliability of the spliced display device, and the first adhesive layer 200 can also avoid optical problems such as refraction caused by the air in the gap between the display panels 100. By setting L1+L2+k to be smaller than or equal to L, a fluctuation of the process error is allowed, so that a difference between L and a distance between the second light-emitting device 51 in the last second pixel row 32 in the former display panel 100 and the first light-emitting device 41 in the first pixel row 31 in the latter display panel 100 will not be too large, so that the spliced display device can eliminate the visual splicing gap as much as possible to better achieve seamless splicing.

In some embodiments, since the width of the adhesive layer is usually around 100 μm, (L1+L2) can satisfy: L1+L2+100 μm≤L.

The above are merely exemplary embodiments of the present disclosure, but are not intended to limit the present disclosure. Any modification, equivalent replacement, improvement, etc., made within the spirit and principle of the present disclosure shall fall within the protection scope of the present disclosure.

It should be understood that the above embodiments are only intended to illustrate, but not to limit, the technical solutions of the present disclosure. Although the present disclosure is described in detail with reference to the preferred embodiments as above, those skilled in the art can still modify the technical solutions described in the foregoing embodiments, or equivalently replace some or all of the technical features. These modifications or replacements do not deviate the essence of the corresponding technical solutions from the scope of the technical solutions of the present disclosure.

What is claimed is:

1. A display panel, comprising:
a first edge and a second edge that are opposite to each other along a first direction;
pixel rows arranged along the first direction and comprising a first pixel row and second pixel rows, wherein the first pixel row is adjacent to the first edge and comprises first sub-pixels arranged along a second direction, and each of the first sub-pixels comprises a first light-emitting device and a first pixel circuit that are electrically connected to each other; and wherein each of the second pixel rows comprises second sub-pixels arranged along the second direction, and each of the second sub-pixels comprises a second light-emitting device and a second pixel circuit that are electrically connected to each other, and wherein the second direction intersects with the first direction; and
first spacing regions corresponding to the second pixel rows in a one-to-one correspondence, wherein each first spacing region of the first spacing regions is adjacent to a corresponding second pixel row of the second pixel rows corresponding to the first spacing region, and wherein the first spacing region is located at a side of the corresponding second pixel row adjacent to the first edge,
wherein the second pixel rows comprise a second A pixel row adjacent to the first pixel row, the first pixel circuit is located at a side of the first light-emitting device away from the first edge, the first pixel circuit is located in the first spacing region corresponding to the second A pixel row, and the second pixel circuit is located at a side of the second light-emitting device adjacent to the first edge,
wherein the first light-emitting device comprises an anode electrically connected to the first pixel circuit through a first connection part, and a cathode electrically connected to a first negative power supply signal line; and
wherein the anode of the first light-emitting device is located at a side of the cathode of the first light-emitting device away from the first pixel circuit.

2. The display panel according to claim 1, wherein a distance L1 between the first edge and an edge of the first light-emitting device and a distance L2 between the second edge and an edge of the second light-emitting device that is closest to the second edge satisfy: L2>L1.

3. The display panel according to claim 1, further comprising: a pin adjacent to the second edge and electrically connected to a first end of a side line, wherein the side line is bent to a backlight side of the display panel and comprises a second end electrically connected to a circuit board.

4. The display panel according to claim 1, further comprising: a first driver signal line electrically connected to the first pixel circuit, wherein the first driver signal line extends along the second direction and is located in the first spacing region corresponding to the second A pixel row.

5. The display panel according to claim 4,
wherein the first pixel circuit is electrically connected to a scanning signal line, a first positive power supply signal line, a reset signal line, and a light-emitting control signal line; and
wherein the first driver signal line comprises at least one of the scanning signal line, the first positive power supply signal line, the reset signal line, or the light-emitting control signal line.

6. The display panel according to claim 1, wherein a first connection line is provided between the first connection part and the first pixel circuit and connects the first connection part and the first pixel circuit, and the first connection line comprises a first line segment and a second line segment that are connected to each other, and wherein an end of the first line segment is electrically connected to the first connection part, at least part of the first line segment extends along the second direction, and the second line segment extends at a side of the first light-emitting device along the second direction.

7. The display panel according to claim 6, wherein the first line segment extends along the second direction, and the first connection part is located at a side of the anode of the first light-emitting device in the second direction.

8. The display panel according to claim 1, further comprising an electrostatic protection circuit located between two adjacent first light-emitting devices in the second A pixel row.

9. The display panel according to claim 1, wherein the first pixel circuit is in mirror symmetry with the second pixel circuit in the first A pixel row in the first direction.

10. The display panel according to claim 1, wherein a distance d1 between an edge of the first light-emitting device and an edge of the second light-emitting device in the second A pixel row and a distance d2 between edges of second light-emitting devices respectively located in two adjacent second pixel rows satisfy: d1=d2.

11. The display panel according to claim 10, further comprising cascaded shift registers located in at least one of the first spacing regions.

12. The display panel according to claim 10, wherein the second light-emitting device has an anode electrically connected to the second pixel circuit and a cathode electrically connected to a third negative power supply signal line, and the third negative power supply signal line is located in the first spacing region located at a side of the second light-emitting device away from the first pixel row.

13. The display panel according to claim 1,
    wherein the first light-emitting device has an anode electrically connected to the first pixel circuit and a cathode electrically connected to a first negative power supply signal line, and the first negative power supply signal line extends along the second direction; and
    wherein the first negative power supply signal line overlaps with the first light-emitting device in a direction perpendicular to a plane of the display panel.

14. The display panel according to claim 13, further comprising cascaded shift registers located in at least one of the first spacing regions, wherein the first pixel circuit has a size r1 in the first direction, one of the shift registers has a size r2 in the first direction, r1<r2, and, a part of the first light-emitting device is located in the first spacing region corresponding to the second A pixel row.

15. The display panel according to claim 1, further comprising cascaded shift registers located in at least one of the first spacing regions that is located at a side of the second A pixel row away from the first pixel row.

16. The display panel according to claim 15,
    wherein the second pixel rows comprise a second B pixel row adjacent to the second A pixel row; and
    wherein the shift registers comprise a first shift register electrically connected to the first pixel row and a second shift register electrically connected to the second A pixel row, and each of the first shift register and the second shift register are located in the first spacing region corresponding to the second B pixel row.

17. The display panel according to claim 1, further comprising cascaded shift registers, wherein the second pixel rows comprise a second C pixel row adjacent to the second edge, and the shift registers are located in at least one of the first spacing regions that is at a side of the second C pixel row away from the second edge.

18. The display panel according to claim 1, further comprising gate circuits electrically connected to the first sub-pixel and the second sub-pixel through data lines, wherein the second pixel rows comprise a second C pixel row adjacent to the second edge, and the gate circuits are located in at least one of the first spacing regions that is located at a side of the second C pixel row away from the second edge.

19. The display panel according to claim 1, wherein a distance L1 between the first edge and an edge of the first light-emitting device, a distance L2 between the second edge and an edge of the second light-emitting device closest to the second edge, and a distance L between edges of the second light-emitting devices respectively located in two adjacent second pixel rows satisfy: L1+L2≤L.

20. The display panel according to claim 1, further comprising a pin adjacent to the second edge,
    wherein the second pixel rows comprise a second C pixel row adjacent to the second edge, wherein the second C pixel row comprises pixel units arranged along the second direction, and wherein the pixel units comprise the second sub-pixels arranged along the second direction;
    wherein the second C pixel row comprises a second spacing region located between two adjacent pixel units of the pixel units;
    wherein the pin overlaps with the second spacing region in the first direction; and
    wherein a part of the pin is located in the second spacing region.

21. A spliced display device, comprising at least two display panels, wherein each of the at least two display panels comprises:
    a first edge and a second edge that are opposite to each other along a first direction;
    pixel rows arranged along the first direction and comprising a first pixel row and second pixel rows, wherein the first pixel row is adjacent to the first edge and comprises first sub-pixels arranged along a second direction, and each of the first sub-pixels comprises a first light-emitting device and a first pixel circuit that are electrically connected to each other; and wherein each of the second pixel rows comprises second sub-pixels arranged along the second direction, and each of the second sub-pixels comprises a second light-emitting device and a second pixel circuit that are electrically connected to each other, and wherein the second direction intersects with the first direction; and
    first spacing regions corresponding to the second pixel rows in a one-to-one correspondence, wherein each first spacing region of the first spacing regions is adjacent to a corresponding second pixel row of the second pixel rows corresponding to the first spacing region, and is located at a side of the corresponding second pixel row adjacent to the first edge,
    wherein the second pixel rows comprise a second A pixel row adjacent to the first pixel row, the first pixel circuit is located at a side of the first light-emitting device away from the first edge, the first pixel circuit is located in the first spacing region corresponding to the second A pixel row, and the second pixel circuit is located at a side of the second light-emitting device close to the first edge, and wherein the at least two display panels are spliced together along the first direction, wherein the first light-emitting device comprises an anode electrically connected to the first pixel circuit through a first connection part, and a cathode electrically connected to a first negative power supply signal line; and wherein the anode of the first light-emitting device is located at a side of the cathode of the first light-emitting device away from the first pixel circuit.

22. The spliced display device according to claim 21, further comprising a first adhesive layer located between two adjacent display panels of the at least two display panels in the first direction, wherein the first adhesive layer has a width k in the first direction, and wherein in one of the at least two display panels, a distance L1 between the first edge and an edge of the first light-emitting device, a distance L2 between the second edge and an edge of the second light-emitting device closest to the second edge, and a distance L between edges of the second light-emitting devices respectively located in two adjacent second pixel rows satisfy: L1+L2+k≤L.

23. A display panel, comprising:

a first edge and a second edge that are opposite to each other along a first direction;

pixel rows arranged along the first direction and comprising a first pixel row and second pixel rows, wherein the first pixel row is adjacent to the first edge and comprises first sub-pixels arranged along a second direction, and each of the first sub-pixels comprises a first light-emitting device and a first pixel circuit that are electrically connected to each other; and wherein each of the second pixel rows comprises second sub-pixels arranged along the second direction, and each of the second sub-pixels comprises a second light-emitting device and a second pixel circuit that are electrically connected to each other, and wherein the second direction intersects with the first direction; and first spacing regions corresponding to the second pixel rows in a one-to-one correspondence, wherein each first spacing region of the first spacing regions is adjacent to a corresponding second pixel row of the second pixel rows corresponding to the first spacing region, and wherein the first spacing region is located at a side of the corresponding second pixel row adjacent to the first edge, wherein the second pixel rows comprise a second A pixel row adjacent to the first pixel row, the first pixel circuit is located at a side of the first light-emitting device away from the first edge, the first pixel circuit is located in the first spacing region corresponding to the second A pixel row, and the second pixel circuit is located at a side of the second light-emitting device adjacent to the first edge, wherein a distance d1 between an edge of the first light-emitting device and an edge of the second light-emitting device in the second A pixel row and a distance d2 between edges of second light-emitting devices respectively located in two adjacent second pixel rows satisfy: d1=d2, wherein the second light-emitting device has an anode electrically connected to the second pixel circuit and a cathode electrically connected to a third negative power supply signal line, and the third negative power supply signal line is located in the first spacing region located at a side of the second light-emitting device away from the first pixel row.

* * * * *